US010186986B2

(12) United States Patent
Mueller

(10) Patent No.: US 10,186,986 B2
(45) Date of Patent: Jan. 22, 2019

(54) SEMICONDUCTOR ARRANGEMENT WITH CONTROLLABLE SEMICONDUCTOR ELEMENTS

(71) Applicant: Infineon Technologies AG, Neubiberg (DE)

(72) Inventor: Christian Robert Mueller, Schweinfurt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/965,491

(22) Filed: Apr. 27, 2018

(65) Prior Publication Data

US 2018/0316277 A1   Nov. 1, 2018

(30) Foreign Application Priority Data

Apr. 28, 2017   (EP) ..................... 17168708

(51) Int. Cl.
*H02M 7/487* (2007.01)
*H02M 7/00* (2006.01)
*H02M 5/458* (2006.01)

(52) U.S. Cl.
CPC ........... *H02M 7/487* (2013.01); *H02M 5/458* (2013.01); *H02M 7/003* (2013.01)

(58) Field of Classification Search
CPC ........ H02M 7/003; H02M 7/48; H02M 7/483; H02M 7/487; H02M 5/458
See application file for complete search history.

(56) References Cited

U.S. PATENT DOCUMENTS

| 5,512,790 | A | 4/1996 | Lachenmaier et al. |
| 5,544,038 | A | 8/1996 | Fisher et al. |
| 9,136,695 | B2* | 9/2015 | Takizawa ............. H02H 7/1203 |
| 9,142,956 | B2* | 9/2015 | Yatsu ........................ H02J 1/00 |
| 2015/0365011 | A1* | 12/2015 | Ilves .................... H02M 7/483 |
| | | | 363/126 |

(Continued)

FOREIGN PATENT DOCUMENTS

| DE | 202013104146 U1 | 11/2013 |
| KR | 101505545 B1 | 3/2015 |
| WO | 2015098651 A1 | 7/2015 |

*Primary Examiner* — Matthew Nguyen
(74) *Attorney, Agent, or Firm* — Murphy, Bilak & Homiller, PLLC

(57) ABSTRACT

First and second semiconductor main-elements, each having a control electrode and a load path, the load paths connected in series between first and second supply nodes, are connected with each other via a first common node. Third and fourth semiconductor main-elements, each having a control electrode and a load path, the load paths connected in series and between a third supply node and the second supply node, are connected with each other via a second common node. A fifth semiconductor main-element has a control electrode and a load path operatively connected between the first common node and an output node. A sixth semiconductor main-element has a control electrode and a load path operatively connected between the second common node and the output node. At least two of the controllable semiconductor main-elements each include a plurality of identical controllable semiconductor subcomponents.

15 Claims, 7 Drawing Sheets

(56) References Cited

U.S. PATENT DOCUMENTS

| | | | |
|---|---|---|---|
| 2016/0056732 A1* | 2/2016 | Jussila | H02M 7/487 363/131 |
| 2016/0182032 A1* | 6/2016 | Goto | H03M 5/00 327/436 |
| 2016/0276927 A1 | 9/2016 | Das et al. | |
| 2016/0351505 A1 | 12/2016 | Tamada et al. | |

* cited by examiner

|    | T1 | T2 | T3 | T4 | T5 | T6 |
|----|----|----|----|----|----|----|
| X1 | 1  | 0  | 0  | 0  | 1  | 0  |
| X2 | 0  | 1  | 1  | 0  | 1  | 1  |
| X3 | 0  | 0  | 0  | 1  | 0  | 1  |
| X4 | 0  | 1  | 1  | 0  | 1  | 1  |

SEMICONDUCTOR ARRANGEMENT WITH CONTROLLABLE SEMICONDUCTOR ELEMENTS

TECHNICAL FIELD

The instant disclosure relates to semiconductor arrangements having controllable semiconductor elements.

BACKGROUND

Semiconductor arrangements, like power semiconductor modules or the like, are widely used in automotive, industrial, and consumer electronic applications for driving loads, converting power, or the like. Such a semiconductor arrangement may include an ANPC (Advanced Neutral-Point Clamped) topology, for example. An ANPC topology includes several controllable semiconductor elements, each semiconductor element having a load path formed between a first load electrode (e.g. a source electrode or an emitter electrode) and a second load electrode (e.g. a drain electrode or a collector electrode), and a control electrode (e.g. a gate or base electrode). However, implementing an ANPC topology in a semiconductor module often leads to poor switching characteristics and a non-satisfactory thermal performance.

Hence, there is a general need for a semiconductor assembly with improved switching characteristics and an improved thermal performance.

SUMMARY

The semiconductor arrangement includes a first supply node configured to be operatively connected to a first electrical potential, a second supply node configured to be operatively connected to a second electrical potential, and a third supply node configured to be operatively connected to a third electrical potential, the first electrical potential being positive with reference to the second electrical potential and the third electrical potential being negative with reference to the second electrical potential. The arrangement further includes a first controllable semiconductor main-element and a second controllable semiconductor main-element, each having a control electrode and a controllable load path between two load electrodes, the load paths operatively connected in series and between the first supply node and the second supply node, the first controllable semiconductor main-element and the second semiconductor main-element being connected with each other via a first common node. The arrangement further includes a third controllable semiconductor main-element and a fourth controllable semiconductor main-element, each having a control electrode and a controllable load path between two load electrodes, the load paths operatively connected in series and between the third supply node and the second supply node, the third controllable semiconductor main-element and the fourth controllable semiconductor main-element being connected with each other via a second common node. The arrangement further includes a fifth controllable semiconductor main-element having a control electrode and a controllable load path between two load electrodes, the load path being operatively connected between the first common node and an output node, and a sixth controllable semiconductor main-element having a control electrode and a controllable load path between two load electrodes, the load path being operatively connected between the second common node and the output node. Each of at least two of the controllable semiconductor main-elements comprises a plurality of identical controllable semiconductor subcomponents, each subcomponent having a control electrode and a controllable load path between a first load electrode and a second load electrode, the load paths being operatively connected in parallel between the nodes between which the respective controllable semiconductor main-element is connected. In each one of the at least two of the controllable semiconductor main-elements, the first load electrode of each respective controllable semiconductor subcomponent is electrically connected to the respective node via an individual one of a multiplicity of separate output lines, each of the separate output lines being configured to provide identical voltage and current transfers.

Those skilled in the art will recognize additional features and advantages upon reading the following detailed description, and upon viewing the accompanying drawings.

BRIEF DESCRIPTION OF THE DRAWINGS

The invention may be better understood with reference to the following drawings and the description. The components in the figures are not necessarily to scale, emphasis instead being placed upon illustrating the principles of the invention. In the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. As well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line as described herein may be a single electrically conductive element, or include at least two individual electrically conductive elements connected in series and/or parallel. Electrical lines may include metal and/or semiconductor material, and may be permanently electrically conductive (i.e., non-switchable). An electrical line may have an electrical resistivity that is independent from the direction of a current flowing through it. A semiconductor body as described herein may be made of (doped) semiconductor material and may be a semiconductor chip or be included in a semiconductor chip. A semiconductor body has electrically connecting pads and includes at least one semiconductor element with electrodes. The pads are electrically connected to the electrodes which includes that the pads are the electrodes and vice versa.

Figure 1:
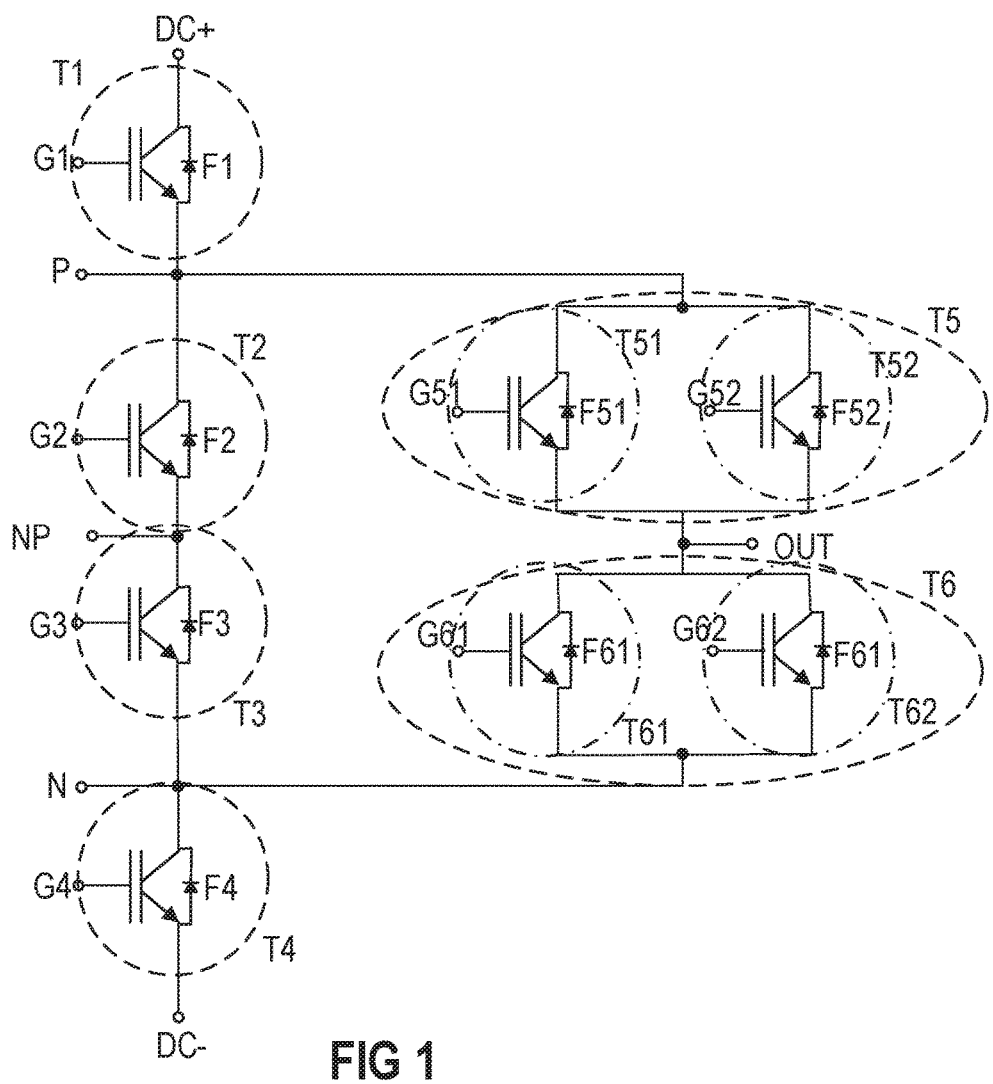
FIG. 1 is a circuit diagram of an exemplary semiconductor arrangement.

Referring to FIG. 1, a semiconductor arrangement is schematically illustrated. The semiconductor arrangement of FIG. 1 may include and may be operated in the way of an ANPC (Advanced Neutral-Point Clamped) topology. The semiconductor arrangement in FIG. 1 includes a first supply node DC+ which is configured to be operatively connected to a first electrical potential. The semiconductor arrangement further includes a second supply node NP which is configured to be operatively connected to a second electrical potential. A third supply node DC− is configured to be operatively connected to a third electrical potential. The first potential is positive with reference to the second potential and the third potential is negative with reference to the second potential. The arrangement further includes a first controllable semiconductor main-element T1 and a second controllable semiconductor main-element T2. Each of the first controllable semiconductor main-element T1 and the second controllable semiconductor main-element T2 includes a control electrode G1, G2 and a controllable load path between a first load electrode and a second load electrode. The load paths of the first controllable semiconductor main-element T1 and the second controllable semiconductor main-element T2 are coupled in series and between the first supply node DC+ and the second supply node NP.

The arrangement further includes a third controllable semiconductor main-element T3 and a fourth controllable semiconductor main-element T4. Each of the third controllable semiconductor main-element T3 and the fourth controllable semiconductor main-element T4 includes a control electrode G3, G4 and a controllable load path between a first load electrode and a second load electrode. The load paths of the third controllable semiconductor main-element T3 and the fourth controllable semiconductor main-element T4 are coupled in series and between the second supply node NP and the third supply node DC−.

The first controllable semiconductor main-element T1 and the second controllable semiconductor main-element T2 are connected with each other via a first common node P. and the third controllable semiconductor main-element T3 and the fourth controllable semiconductor main-element T4 are connected with each other via a second common node N.

The arrangement further includes a fifth controllable semiconductor main-element T5 having a control electrode G5 and a controllable load path between two load electrodes, the load path being operatively connected between the first common node P and an output node OUT, and a sixth controllable semiconductor main-element T6 having a control electrode G6 and a controllable load path between two load electrodes, the load path being operatively connected between the second common node N and the output node OUT.

Each of at least two of the controllable semiconductor main-elements T1, T2, T3, T4, T5, T6 includes a plurality of identical controllable semiconductor subcomponents, each subcomponent having a control electrode and a controllable load path between a first load electrode and a second load electrode, the load paths being operatively connected in parallel between the nodes between which the respective controllable semiconductor main-element is connected. This is exemplarily illustrated in FIG. 1, where the fifth controllable semiconductor main-element T5 includes a plurality of identical fifth controllable semiconductor subcomponents $T5_n$, and the sixth controllable semiconductor main-element T6 includes a plurality of identical sixth controllable semiconductor subcomponents $T6_n$. The arrangement in the example of FIG. 1 includes two identical fifth controllable semiconductor subcomponents $T5_1$, $T5_2$ and two identical sixth controllable semiconductor subcomponents $T6_1$, $T6_2$. This is, however, only an example. It is also possible that the semiconductor arrangement includes more than two identical fifth controllable semiconductor subcomponents $T5_n$ and more than two identical sixth controllable semiconductor subcomponents $T6_n$. Each of the plurality of fifth controllable semiconductor subcomponents $T5_n$ includes a control electrode $G5_n$ and a controllable load path between a first load electrode and a second load electrode. The load paths of the plurality of fifth controllable semiconductor subcomponents $T5_n$ are connected in parallel and between the nodes between which the respective controllable semiconductor main-component T5 is connected, namely the first common node P and the output node OUT. Each of the plurality of sixth controllable semiconductor subcomponents $T6_n$ includes a control electrode $G6_n$ and a controllable load path between a first load electrode and a second load electrode. The load paths of the plurality of sixth controllable semiconductor subcomponents $T6_n$ are connected in parallel and between the nodes between which the respective controllable semiconductor main-component T6 is connected, namely the output node OUT and the second common node N.

In the following, the general principle of the invention is described by means of the fifth and the sixth controllable semiconductor main-element T5, T6. However, any other two of the controllable semiconductor main-elements T1, T2, T3, T4, T5, T6 of the arrangement in FIG. 1 may each include a plurality of controllable semiconductor subcomponents $T5_n$, $T6_n$. For example, instead of the fifth and sixth controllable semiconductor main-element T5, T6, the first and the fourth controllable semiconductor main-element T1, T4 or the second and the third controllable semiconductor main element T2, T3 may each include a plurality of controllable semiconductor subcomponents. According to an even further example, more than two of the controllable semiconductor main-elements T1, T2, T3, T4, T5, T6 include a plurality of controllable semiconductor subcomponents. For example, four of the controllable semiconductor main-elements T1, T2, T3, T4, T5, T6 or even all six of the controllable semiconductor main-elements T1, T2, T3, T4, T5, T6 may include a plurality of controllable semiconductor subcomponents. The general principle described below may be easily applied to any other components of the arrangement illustrated in FIG. 1.

According to one example, the first controllable semiconductor main-element T1 and the fourth controllable semiconductor main-element T4 form a first commutation path, the second controllable semiconductor main-element T2 and the third controllable semiconductor main-element T3 form a second commutation path, and the fifth controllable semiconductor main-element T5 and the sixth controllable semiconductor main-element T6 form a third commutation path.

For example, the controllable semiconductor main-elements in one commutation path may be implemented in the way described below.

Each of the controllable semiconductor main-elements T1-T6 and each of the controllable semiconductor subcomponents T5$_n$. T6$_n$ in the arrangement of FIG. 1 may include an intrinsic freewheeling element F, F2, F3, F4, F5$_n$, F6$_n$ such as a body diode, which is electrically connected between the first load electrode and the second load electrode of the respective controllable semiconductor element T1-T6 or subcomponent T5$_n$, T6$_n$.

Figure 3:
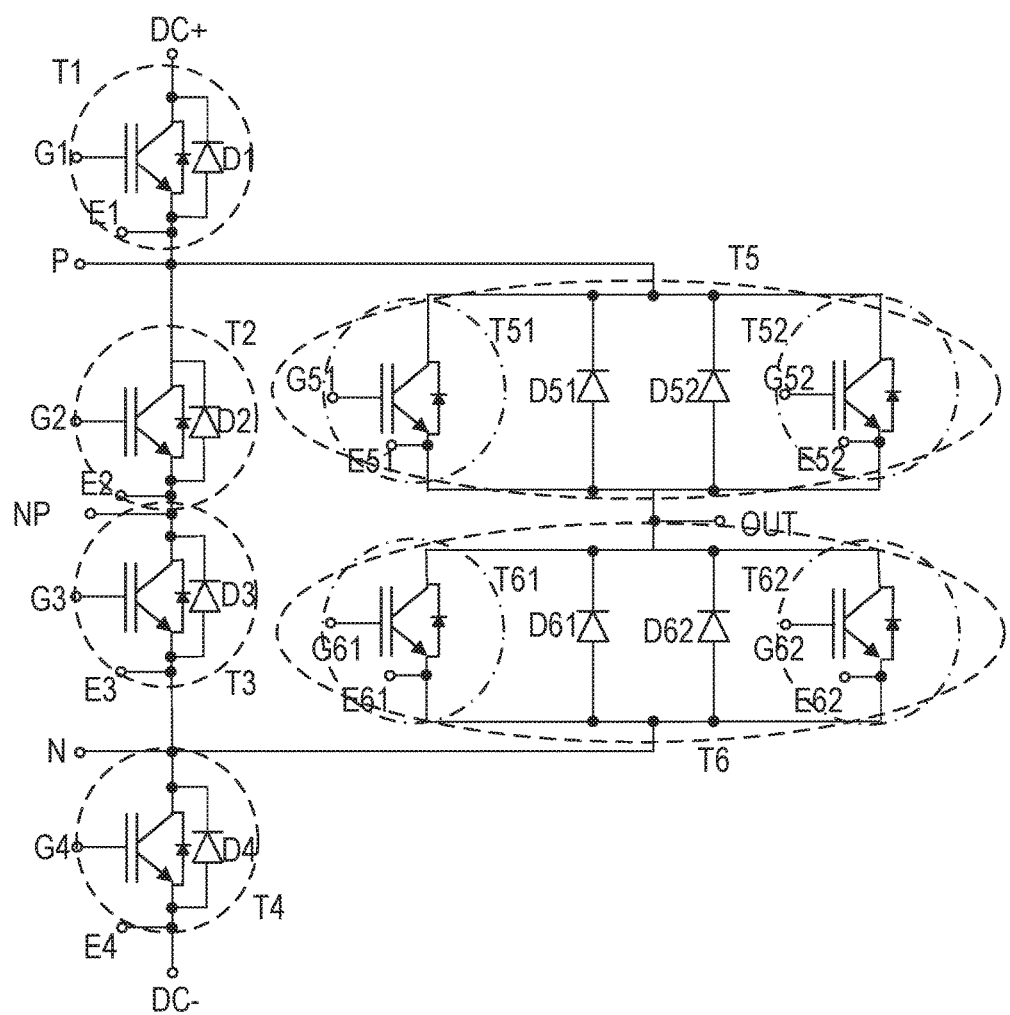
FIG. 3 is a circuit diagram of another exemplary semiconductor arrangement.

Referring to FIG. 3, the semiconductor arrangement may include further freewheeling elements D1, D2. D3, D4, D5$_n$, D6$_n$. Each of the further freewheeling elements D1-D6$_n$ includes a first electrode and a second electrode. Each of the further freewheeling elements D1-D6, may be connected in parallel to one of the controllable semiconductor main-elements T1-T6$_n$ or subcomponents T5$_n$. T6$_n$. For example, a first freewheeling element D may be connected to the first supply node DC+ with its second electrode and to the first common node P with its first electrode such that it is connected between the first supply node DC+ and the first common node P and in parallel to the load path of the first controllable semiconductor main-element T1. A second freewheeling element D2 may be connected to the first common node P with its second electrode and to the second supply node NP with its first electrode such that it is connected between the first common node P and the second supply node NP and in parallel to the load path of the second controllable semiconductor main-element T2, and so on. Each of the controllable semiconductor main-elements T1-T6 or subcomponents T5$_n$, T6$_n$ may further be connected to a respective auxiliary emitter node E1-E6$_n$ (see FIG. 3). In particular, the first load electrode of each controllable semiconductor main-element T1-T6 or subcomponent T5$_n$, T6$_n$ may be connected to a respective auxiliary emitter node E1-E6$_n$. The auxiliary emitter nodes E1-E6$_n$, however, are optional and may be omitted.

Each of the controllable semiconductor main-elements T1-T6 or subcomponents T5$_n$, T6$_n$ may include a semiconductor switch. The individual semiconductor switches may include a transistor such as a MOSFET (Metal Oxide Semiconductor Field-Effect Transistor), IGBT (Insulated Gate Bipolar Transistor), JFET (Junction Field Effect Transistor), HEMT (High Electron Mobility Transistor), BIP (Bipolar Transistor), or any other kind of transistor, for example.

The individual controllable semiconductor main-elements T1-T6 and, therefore, the subcomponents T5$_n$, T6$_n$ may have different switching characteristics and different transmittance characteristics. For example, the fifth controllable semiconductor main-element T5 and, therefore, each of the individual fifth controllable semiconductor subcomponents T5$_n$ may have a first switching characteristic and a first transmittance characteristic. The sixth controllable semiconductor main-element T6 and, therefore, each of the individual sixth controllable semiconductor subcomponents T6$_n$ may have a second switching characteristic and a second transmittance characteristic. The first controllable semiconductor main-element T1 may have a third switching characteristic and a third transmittance characteristic, the second controllable semiconductor main-element T2 may have a fourth switching characteristic and a fourth transmittance characteristic, the third controllable semiconductor main-element T3 may have a fifth switching characteristic and a fifth transmittance characteristic and the fourth controllable semiconductor main-element T4 may have a sixth switching characteristic and a sixth transmittance characteristic. The first switching characteristic may be identical to the second switching characteristic. In another example, however, the first switching characteristic may be different from the second switching characteristic. According to one example, the first transmittance characteristic may be identical to the second transmittance characteristic. In another example, however, the first transmittance characteristic may be different from the second transmittance characteristic. The switching characteristics and transmittance characteristics of the first, second, third and fourth controllable semiconductor main-elements T1-T4 (main-elements not including a plurality of subcomponents) may be different from the first and second switching and transmittance characteristics (main-elements including a plurality of subcomponents). According to one example, the first and second switching and transmittance characteristics are identical and the third, fourth, fifth and sixth switching and transmittance characteristics are identical, whereas the first and second switching and transmittance characteristics are different from the third, fourth, fifth and sixth switching and transmittance characteristics.

According to one example, the saturation voltage VCESAT of two controllable semiconductor main-elements having different switching and transmittance characteristics at the nominal current may differ by ≥100 mV. According to one example, the first, second, third and fourth controllable semiconductor main-elements T1-T4 are implemented as semiconductor elements that are optimized in terms of conductivity and the fifth and sixth controllable semiconductor main-elements T5, T6 and subcomponents T5$_n$, T6$_n$ are implemented as fast switching semiconductor elements. According to another example, the first, second, third and fourth controllable semiconductor main-elements T1-T4 are implemented as fast switching semiconductor elements and the fifth and sixth controllable semiconductor main-elements T5, T6 and subcomponents T5$n$, T6$n$ are implemented as semiconductor elements that are optimized in terms of conductivity.

The controllable semiconductor main-elements T1-T6 and subcomponents T5$_n$, T6$_n$ may be included in discrete semiconductor bodies and include the intrinsic freewheeling elements F1-F6$_n$ such as body diodes, which are electrically connected between the first load electrodes and the second load electrodes of the respective controllable semiconductor main-element T1-T6 or subcomponent T5$_n$, T6$_n$. The further freewheeling elements D1-D6 may have a forward voltage that is lower than the forward voltage of the intrinsic freewheeling elements F1-F6$_n$. In this case, the further freewheeling element D1-D6$_n$ is the element that provides the freewheeling and not one of the body diodes, e.g., if the body diodes are not suitable for a certain freewheeling purpose. The further freewheeling elements D1-D6$_n$ may be included in separate discrete semiconductor bodies other than the semiconductor bodies including the controllable semiconductor main-elements T1-T6 and subcomponents T5$_n$, T6$_n$ with their intrinsic freewheeling elements F1-F6$_n$, as will be described with reference to FIGS. 7 and 8 below.

Figure 2:
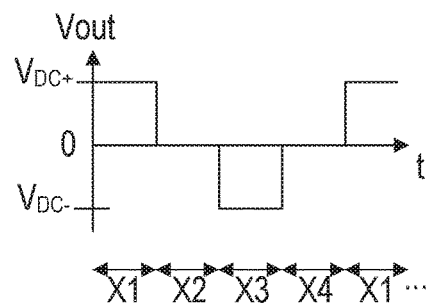
FIG. 2 schematically illustrates a switching sequence of the controllable semiconductor main-elements in the semiconductor arrangement of FIG. 1.

FIG. 2 illustrates an example of a switching sequence of the semiconductor arrangement of FIG. 1. In the example of FIG. 1, the first electrical potential DC+ is a positive potential with respect to the second potential NP and the third electrical potential DC− is a negative potential with respect to the second potential NP. During a first time interval X1, the first controllable semiconductor main-element T1 and at least one of the fifth controllable semiconductor subcomponents T5$_n$ are switched on ("1"), while the second, third, fourth and sixth controllable semiconductor main-elements T2, T3, T4, T6 are switched off ("0"). Thereby, a positive voltage Vout=$V_{DC+}$ is provided at the output node OUT during the first time interval X1. During a second time interval X2, the second and third controllable semiconductor main-elements T2, T3, at least one of the fifth controllable semiconductor subcomponents $T5_n$ and at least one of the sixth controllable semiconductor subcomponents $T6_n$ are switched on ("1"), while the first and fourth controllable semiconductor main-elements T1, T4 are switched off ("0"). Thereby, a voltage of Vout=V_NP, e.g. Vout=0V, is provided at the output node OUT during the second time interval X2. During a third time interval X3, the fourth controllable semiconductor main-element T4 and at least one of the sixth controllable semiconductor subcomponents $T6_n$ are switched on ("1"), while the first, second, third and fifth controllable semiconductor main-elements T1, T2, T3, $T5_n$ are switched off ("0"). Thereby, a negative voltage Vout=$V_{DC-}$ is provided at the output node OUT during the third time interval X3. The third time interval is followed by a fourth time interval X4. The switching states of the controllable semiconductor main-elements T1-T6 and subcomponents $T5_n$, $T6_n$ during the fourth time interval correspond to the switching states of the controllable semiconductor main-elements T1-T6 and subcomponents $T5_n$, $T6_n$ during the second time interval X2, thereby providing a voltage of Vout=V_NP, e.g. Vout=0V, at the output node OUT again during the fourth time interval X4. The switching sequence X1, X2, X3, X4 is then repeated, starting again with the switching states of the first time interval X1, and so on. In this way, an alternating voltage is provided at the output node OUT, as is exemplarily illustrated in FIG. 2.

During the first, second and fourth time interval X1, X2, X4 all of the plurality of identical fifth controllable semiconductor subcomponents $T5_n$ or only a subset of the plurality of fifth controllable semiconductor subcomponents $T5_n$ (but at least one of the plurality of fifth controllable semiconductor subcomponents $T5_n$) may be switched on. For example, when the semiconductor arrangement is operated in a partial-load range, only a subset (but at least one) of the plurality of fifth controllable semiconductor subcomponents $T5_n$ may be switched on. When the semiconductor arrangement is operated in a full load range, all of the plurality of identical fifth controllable semiconductor subcomponents $T5_n$ may be switched on, for example. During the second, third and fourth time interval X2, X3, X4 all of the plurality of identical sixth controllable semiconductor subcomponents $T6_n$ or only a subset of the plurality of sixth controllable semiconductor subcomponents $T6_n$ (but at least one of the plurality of sixth controllable semiconductor subcomponents $T6_n$) may be switched on. For example, when the semiconductor arrangement is operated in a partial-load range, only a subset (but at least one) of the plurality of sixth controllable semiconductor subcomponents $T6_n$ may be switched on. When the semiconductor arrangement is operated in a full load range, all of the plurality of identical sixth controllable semiconductor subcomponents $T6_n$ may be switched on, for example.

"Switched on" in this context means that the respective controllable semiconductor main-element T1-T6 or subcomponents $T5_n$, $T6_n$ is conducting and a current may flow through the controllable load path between the two load electrodes. If a controllable semiconductor main-element T1-T6 or subcomponent $T5_n$, $T6_n$ is "switched off", the controllable semiconductor main-element T1-T6 or subcomponent $T5_n$, $T6_n$ is in a blocking state and no current may flow through the load path between the two load electrodes.

Figure 4A:
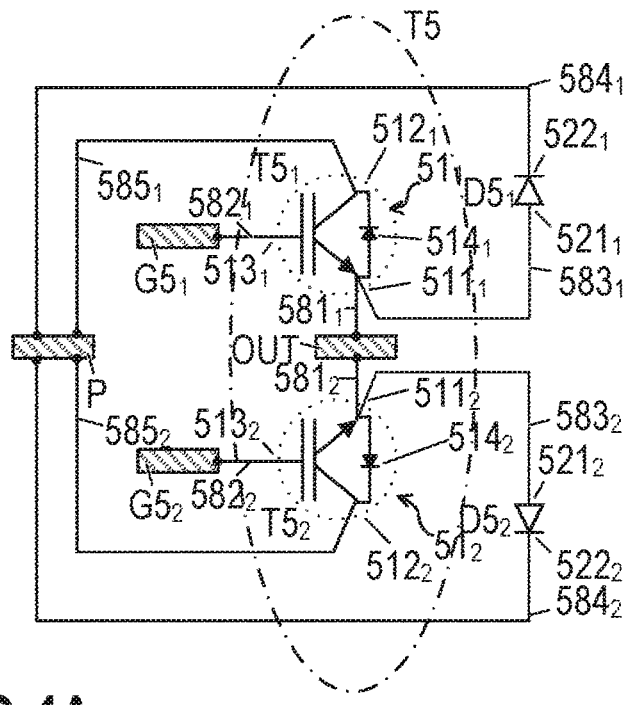
FIGS. 4A and 4B are respective circuit diagrams of sections of the semiconductor arrangement of FIG. 1.

Referring to FIG. 4A, a section of the semiconductor arrangement of FIG. 1 is illustrated. In particular, FIG. 4A illustrates the plurality (here: two) of identical fifth controllable semiconductor subcomponents $T5_1$, $T5_2$ (also referred to as controllable semiconductor subcomponents $T5_n$) such as, e.g., insulated gate bipolar transistors, a plurality (here: two) of fifth freewheeling elements $D5_1$, $D5_2$ (e.g., diodes), the first common node P, the output node OUT and control nodes $G5_1$, $G5_2$. Each of the two fifth controllable semiconductor subcomponents $T5_1$ and $T5_2$ includes a first load electrode $511_1$, $511_2$ (also referred to as first load electrodes $511_n$) such as an emitter, a second load electrode $512_1$ and $512_2$ (also referred to as second load electrodes $512_n$) such as a collector, and a control electrode $513_1$ and $513_2$ (also referred to as control electrodes $513_n$) such as a gate. A first load path is provided between the first load electrode $511_1$ and the second load electrode $512_1$ of a first of the fifth controllable semiconductor subcomponents $T5_1$. A second load path is provided between the first load electrode $511_2$ and the second load electrode $512_2$ of the second one of the fifth controllable semiconductor subcomponents $T5_2$. The fifth freewheeling elements $D5_1$, $D5_2$ each include a first electrode $521_1$, $521_2$ and a second electrode $522_1$, $522_2$. Each of the fifth controllable semiconductor subcomponents $T5_1$, $T5_2$ includes an intrinsic freewheeling element $514_1$, $514_2$, respectively, which is coupled between the first load electrode $511_1$, $511_2$ and the second load electrode $512_1$, $512_2$ of the respective fifth controllable semiconductor subcomponents $T5_1$, $T5_2$.

The output node OUT is electrically connected to each of the first load electrodes $511_1$ and $511_2$ of the plurality of fifth controllable semiconductor subcomponents $T5_1$ and $T5_2$, via an individual one of a multiplicity of separate first output lines $581_n$. The common node P is electrically connected to each of the second load electrodes $512_1$ and $512_2$ of the plurality of fifth controllable semiconductor subcomponents $T5_1$ and $T5_2$, via an individual one of a multiplicity of separate first feed lines $585_n$ and to each of the second electrodes $522_1$, $522_2$ of the plurality of fifth freewheeling elements $D5_1$, $D5_2$ via an individual one of a multiplicity of separate first connecting lines $584_n$. The control nodes $G5_1$, $G5_2$ are each electrically connected to one of the control electrodes $513_1$ and $513_2$ of the plurality of fifth controllable semiconductor subcomponents $T5_1$ and $T5_2$ via an individual one of a multiplicity of separate first control lines $582_n$. The first electrodes $521_1$, $521_2$ of the plurality of fifth freewheeling elements $D5_1$, $D5_2$ are each electrically connected to one of the first load electrodes $511_1$ and $511_2$ of the plurality of fifth controllable semiconductor subcomponents $T5_1$ and $T5_2$, via an individual one of a multiplicity of separate first branch lines $583_n$.

Symmetrical first output lines $581_1$ and $581_2$ between the first electrodes $511_1$ and $511_2$ and the output node OUT allow for an electrically symmetrical design. Symmetrical first control lines $582_1$ and $582_2$ may be used to connect each of the control nodes $G5_1$, $G5_2$ to one of the control electrodes $513_1$ and $513_2$. Symmetrical first branch lines $583_1$ and $583_2$ may be used to connect the first electrodes $521_1$ and $521_2$ to the first load electrodes $511_1$ and $511_2$ of the plurality of fifth controllable semiconductor subcomponents $T5_1$ and $T5_2$. Symmetrical first connecting lines $584_1$ and $584_2$ may be used to connect the second electrodes $512_1$ and $512_2$ to the first common node P. Symmetrical first feed lines $585_1$ and $585_2$ may be used to connect the second load electrodes $512_1$ and $512_2$ to the first common node P.

Figure 4B:
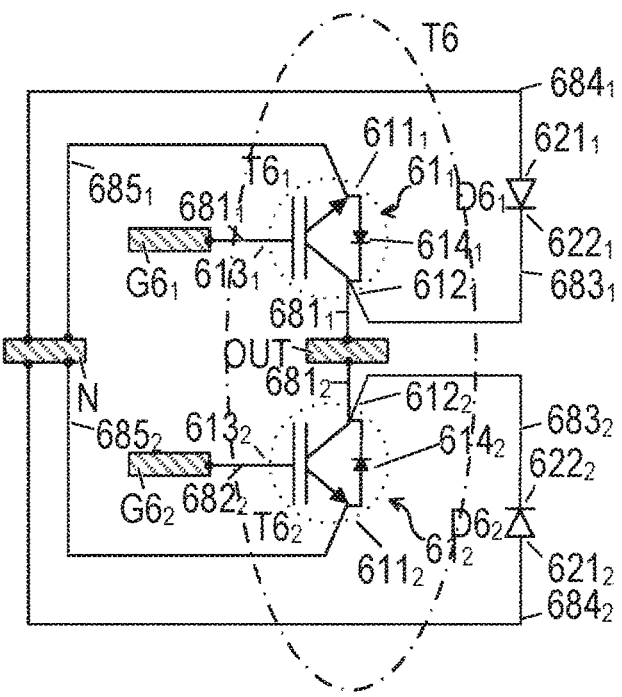

Referring to FIG. 4B, a further section of the semiconductor arrangement of FIG. 1 is illustrated, which is different to the section illustrated in FIG. 4A. In particular, FIG. 4B illustrates the plurality (here: two) of identical sixth controllable semiconductor subcomponents $T6_1$, $T6_2$ (also referred to as controllable semiconductor subcomponents $T6_n$) such as, e.g., insulated gate bipolar transistors, a plurality of sixth freewheeling elements $D6_1$, $D6_2$ (e.g., diodes), the second common node N, the output node OUT and control nodes $G6_1$, $G6_2$. Each of the two sixth controllable semiconductor subcomponents $T6_1$ and $T6_2$ includes a first load electrode $611_1$, $611_2$ (also referred to as first load electrodes $611_n$) such as an emitter, a second load electrode $612_1$ and $612_2$ (also referred to as second load electrodes $612_n$) such as a collector, and a control electrode $613_1$ and $613_2$ (also referred to as control electrodes $613_n$) such as a gate. A first load path is provided between the first load electrode $611$ and the second load electrode $612_1$ of a first one of the sixth controllable semiconductor subcomponents $T6_1$. A second load path is provided between the first load electrode $611_2$ and the second load electrode $612_2$ of the second one of the sixth controllable semiconductor subcomponents $T6_2$. The sixth freewheeling elements $D6_1$, $D6_2$ each include a first electrode $621_1$, $621_2$ and a second electrode $622_1$, $622_2$. Each of the sixth controllable semiconductor subcomponents $T6_1$, $T6_2$ includes an intrinsic freewheeling element $614_1$, $614_2$, respectively, which is coupled between the first load electrode $611_1$, $611_2$ and the second load electrode $612_1$, $612_2$ of the respective sixth controllable semiconductor subcomponents $T6_1$, $T6_2$.

The output node OUT is electrically connected to each of the second load electrodes $612_1$ and $612_2$ of the plurality of sixth controllable semiconductor subcomponents $T6_1$ and $T6_2$ via an individual one of a multiplicity of separate second output lines $681_n$. The second common node N is electrically connected to each of the first load electrodes $611_1$ and $611_2$ of the plurality of sixth controllable semiconductor subcomponents $T6_1$ and $T6_2$ via an individual one of a multiplicity of separate second feed lines $685_n$ and to the first electrodes $621_1$, $621_2$ of the plurality of sixth freewheeling elements $D6_1$, $D6_2$ via an individual one of a multiplicity of separate second connecting lines $684_n$. The control nodes $G6_1$, $G6_2$ are each electrically connected to one of the control electrodes $613_1$ and $613_2$ of the plurality of sixth controllable semiconductor subcomponents $T6_1$ and $T6_2$ via an individual one of a multiplicity of separate second control lines $682_n$. The second electrodes $622_1$, $622_2$ of the plurality of sixth freewheeling elements $D6_1$, $D6_2$ are each electrically connected to one of the second load electrodes $612_1$ and $612_2$ of the plurality of sixth controllable semiconductor subcomponents $T6_1$ and $T6_2$, via an individual one of a multiplicity of separate second branch lines $683_n$.

Symmetrical second output lines $681_1$ and $681_2$ between the second electrodes $612_1$ and $612_2$ of the sixth controllable semiconductor subcomponents $T6_1$, $T6_2$ and the output node OUT allow for an electrically symmetrical design. Symmetrical second control lines $682_1$ and $682_2$ may be used to connect each of the control nodes $G6_1$, $G6_2$ to one of the control electrodes $613_1$ and $613_2$. Symmetrical second branch lines $683_1$ and $683_2$ may be used to connect the second electrodes $622_1$ and $622_2$ to the second load electrodes $612_1$ and $612_2$ of the plurality of sixth controllable semiconductor subcomponents $T6_1$ and $T6_2$. Symmetrical second connecting lines $684_1$ and $684_2$ may be used to connect the first electrodes $621_1$ and $621_2$ to the second common node N. Symmetrical second feed lines $685_1$ and $685_2$ may be used to connect the first load electrodes $611_1$ and $611_2$ to the second common node N.

The following exemplarily further describes the individual fifth controllable semiconductor subcomponents $T5_n$. However, everything that is described with respect to the individual fifth controllable semiconductor subcomponents $T5_n$ applies, mutatis mutandis, to the individual sixth controllable semiconductor subcomponents $T6_n$, or to the individual controllable semiconductor subcomponents of any other controllable semiconductor main-element T1, T2, T3, T4, even if not specifically mentioned.

An electrically symmetrical design provides identical voltage and current transfers over the respective lines so that, for example, identical synchronous voltage impulses input at one end of the lines appear at the same time and in the same shape at the end of the lines. For example, the individual first output lines $581_1$ and $581_2$ may exhibit at least one of identical ohmic behaviors, identical inductive behaviors, and identical capacitive behaviors. This may be achieved, e.g., if the individual first output lines $581_1$ and $581_2$ are wires of identical lengths, identical cross sectional areas, and identical materials. A symmetrical design may improve the transmission characteristics not only of the load circuit but also of the control circuit of the semiconductor arrangement. Additionally, the electrical connections between the control nodes $G5_n$ and the control electrodes $513_n$ of the fifth controllable semiconductor subcomponents $T5_n$, the electrical connection between the second load electrodes $512_n$ and the first common node P. and/or the electrical connection between the first electrodes $521_n$ and the first load electrodes $511_n$ of the fifth controllable semiconductor subcomponents $T5_n$ may have an electrically symmetrical design, respectively. The same applies for the individual second output lines $681_1$ and $681_2$, which may exhibit at least one of identical ohmic behaviors, identical inductive behaviors, and identical capacitive behaviors. Additionally, the electrical connections between the control nodes $G6_n$ and the control electrodes $613_n$ of the sixth controllable semiconductor subcomponents $T6_1$, the electrical connection between the first load electrodes $611_n$ and the second common node N, and/or the electrical connection between the second electrodes $621_n$ and the second load electrodes $612_n$ of the sixth controllable semiconductor subcomponents $T6_n$ may have an electrically symmetrical design, respectively.

The fifth controllable semiconductor subcomponents $T5_1$ and $T5_2$, as well as the sixth controllable semiconductor subcomponents $T6_1$ and $T6_2$, may each be included in a discrete first semiconductor body $51_1$, $51_2$, $61_1$ and $61_2$ (also referred to as semiconductor bodies $51_n$, $61_n$) and include intrinsic freewheeling elements $F5_n$, $F6_n$ such as body diodes, which are electrically connected between the first load electrodes $511_n$, $611_n$ and the second load electrodes $512_n$, $612_n$ of the respective controllable semiconductor subcomponents $T5_n$, $T6_n$. The fifth and sixth freewheeling elements $D5_n$, $D6_n$ may be included in discrete second semiconductor bodies $52_n$.

Figure 5:
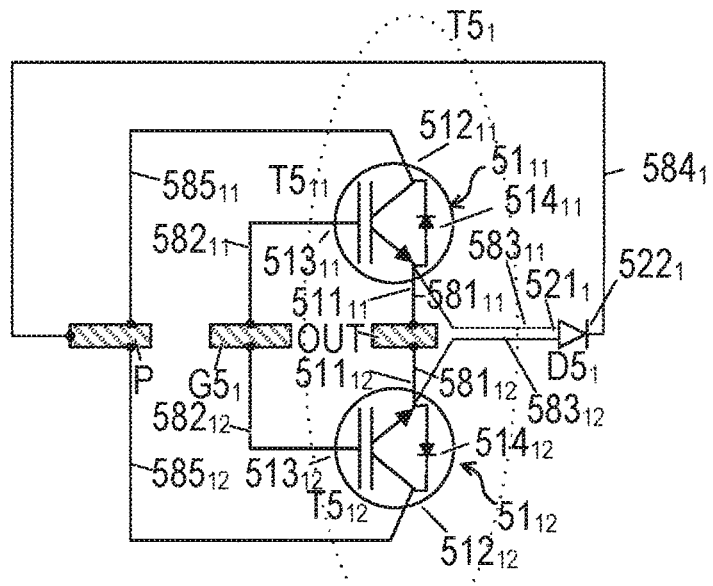
FIG. 5 is a circuit diagram of a section of the semiconductor arrangement of FIG. 4A.

It is also possible that each controllable semiconductor subcomponent $T5_1$, $T5_2$, $T6_1$ and $T6_2$ is formed by more than one first semiconductor body $51_1$, $51_2$, $61_1$ and $61_2$. Referring to FIG. 5, one of the multiplicity of fifth controllable semiconductor subcomponents $T5_1$ of FIG. 4A is illustrated in further detail. The same principle, however, applies, mutatis mutandis, for each of the other fifth controllable semiconductor subcomponents $T5_n$, each of the sixth controllable semiconductor subcomponents $T6_n$, or any other controllable semiconductor subcomponents of any other controllable semiconductor main-element T1, T2, T3, T4.

Referring to FIG. 5, the fifth controllable semiconductor subcomponent $T5_1$ includes two first controllable sub-elements $T5_{11}$, $T5_{12}$. Each first controllable sub-element $T5_{1m}$ includes a first load electrode $511_{1m}$ such as an emitter, a second load electrode $512_{1m}$ such as a collector, and a control electrode $513_{1m}$ such as a gate. The first load electrodes $511_{1m}$ of the first controllable sub-elements $T5_{1m}$ are electrically connected to the output node OUT via an individual one of a multiplicity of separate third output lines $581_{1m}$. The multiplicity of separate third output lines $581_{1m}$ may form one of the multiplicity of first output lines $581_n$ of the arrangement in FIG. 4A. Or, in other words, each of the multiplicity of separate first output lines $581_n$ may include a multiplicity of separate third output lines $581_{1m}$. Each of the second load electrodes $512_{1m}$ is electrically connected to the first common node P via an individual one of a multiplicity of separate third feed lines $585_{1m}$. The multiplicity of third feed lines $585_{1m}$ may form one of the multiplicity of first feed lines $585_n$ of the arrangement in FIG. 4A. Or, in other words, each of the multiplicity of separate first feed lines $585_n$ may include a multiplicity of separate third feed lines $585_{nm}$. The control electrodes $513_{1m}$ of the plurality of first controllable sub-elements $T5_{1m}$ are connected to the same control node $G5_1$ via an individual one of a multiplicity of separate third control lines $582_{1m}$. The multiplicity of third control lines $582_{1m}$ may form one of the multiplicity of first control lines $582_n$ of the arrangement in FIG. 4A. Or, in other words, each of the multiplicity of separate first control lines $582_n$ may include a multiplicity of separate third control lines $582_{nm}$.

The fifth controllable semiconductor subcomponent $T5_1$ in the arrangement of FIG. 5 includes only one freewheeling element $D5_1$. The freewheeling element $D5_1$ includes a first electrode $521_1$ and a second electrode $522_1$. The second electrode $522_1$ is electrically connected to the first common node P via a third connecting line $584_1$. The third connecting line $584_1$ may be one of the multiplicity of first connecting lines $584_n$ as described with reference to FIG. 4A. The first electrode $521_1$ is electrically connected to the first load electrodes $511_{1m}$ of each of the first controllable sub-elements $T5_{1m}$ via a multiplicity of separate third branch lines $583_{1m}$.

An electrically symmetrical design of a first controllable sub-element $T5_{nm}$ may be achieved, for example, if the individual third output lines $581_{nm}$ are wires of identical length, identical cross sectional areas, and identical materials. Further, the individual third control lines $582_{nm}$ and the individual third branch lines $583_{nm}$ may be wires of identical length, identical cross sectional areas, and identical materials, respectively.

Figure 7:
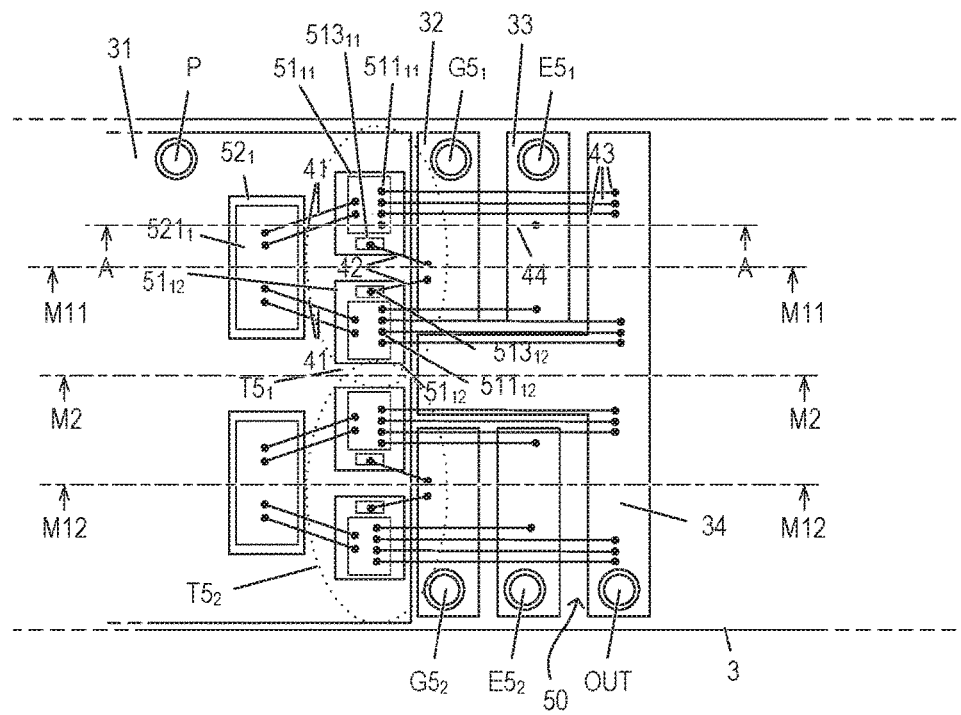
FIG. 7 is a top view illustrating an exemplary semiconductor arrangement.

FIG. 7 schematically illustrates a semiconductor arrangement that includes an exemplary assembled electrically insulated carrier 3, e.g. a circuit board, a substrate or switch plate. In FIG. 7, only a relevant section of the assembled electrically insulated carrier 3 is illustrated. The semiconductor arrangement may include a circuit as illustrated in FIG. 4A. The semiconductor arrangement may also include further semiconductor devices (e.g., the semiconductor devices that are necessary to form the arrangement of FIGS. 1 and 3), such semiconductor devices, however, are not illustrated in FIG. 7 for clarity reasons. As illustrated in FIG. 7, the semiconductor arrangement may include, disposed in each case on the electrically insulated carrier 3 (e.g. on the same surface of the electrically insulated carrier 3), a multiplicity of first semiconductor bodies $51_{nm}$ and a multiplicity of second semiconductor bodies $52_n$. Each of the multiplicity of first semiconductor bodies $51_{nm}$ includes an individual one of the plurality of first controllable sub-elements $T5_{nm}$. The first load electrode $511_{nm}$ the second load electrode $512_{nm}$ and the control electrode $513_{nm}$ of the first controllable sub-elements $T5_{nm}$ may also be electrodes of the corresponding first semiconductor body $51_{nm}$. Further, each of the multiplicity of second semiconductor bodies 52, includes one of the plurality of freewheeling elements $D5_n$. The first electrode $521_n$ and the second electrode $522_n$ of each freewheeling element $D5_n$ may also be electrodes (pads) of the corresponding second semiconductor bodies $52_n$. All first semiconductor bodies $51_n$ may be structurally identical, e.g., of an identical construction with identical electrical properties. All second semiconductor bodies $52_n$ may be structurally identical, e.g., of an identical construction with identical electrical properties. The second semiconductor bodies 52 may be structurally different from the first semiconductor bodies $51_n$.

Each of the plurality of fifth controllable semiconductor subcomponents $T5_n$ may include a plurality of first semiconductor bodies $51_{nm}$ (here: two). Each of the plurality of fifth controllable semiconductor subcomponents $T5_n$ may further include one second semiconductor body $52_n$.

There is no electrical connection between the control electrodes $513_{1m}$ of a first one of the fifth controllable semiconductor subcomponents $T5_1$ including at least one first semiconductor body $51_{11}$, $51_{12}$ and the control electrodes $513_{2m}$ of a second one of the fifth controllable semiconductor subcomponents $T5_2$ including at least one first semiconductor body $51_{2m}$ so that a first control potential can be provided by a first control circuit to the control electrodes $513_{1m}$, and a second control potential having a signal course significantly different from the signal course of the first control potential can be provided by a second control circuit to the control electrodes $513_{2m}$ of one or more further first semiconductor bodies $51_{2m}$.

Figure 8:
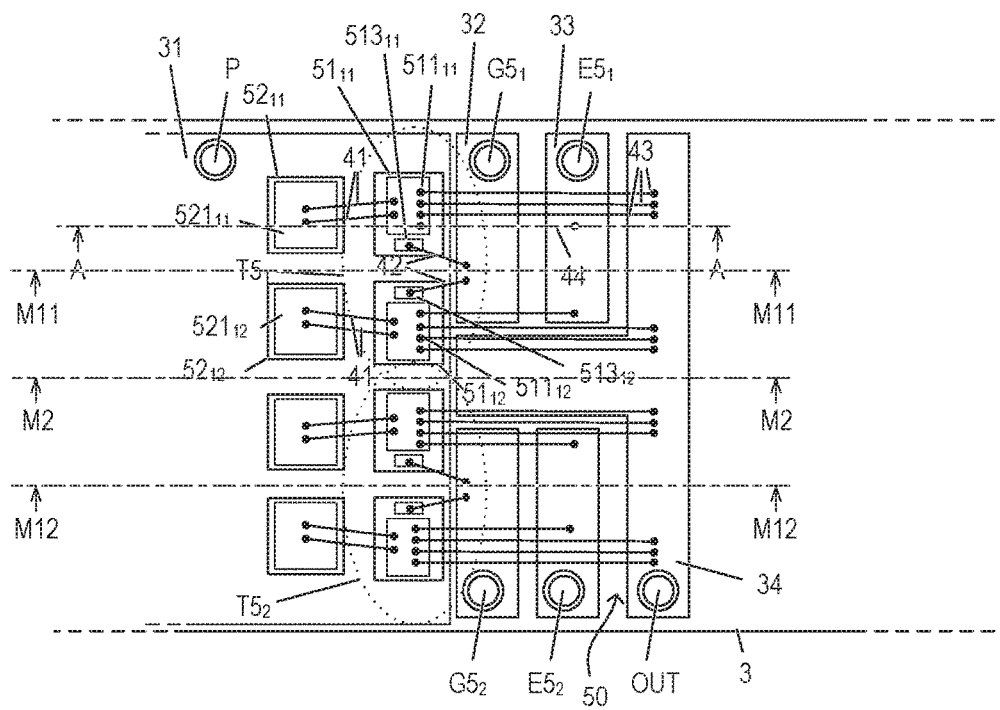
FIG. 8 is a top view illustrating another exemplary semiconductor arrangement.
Figure 9:
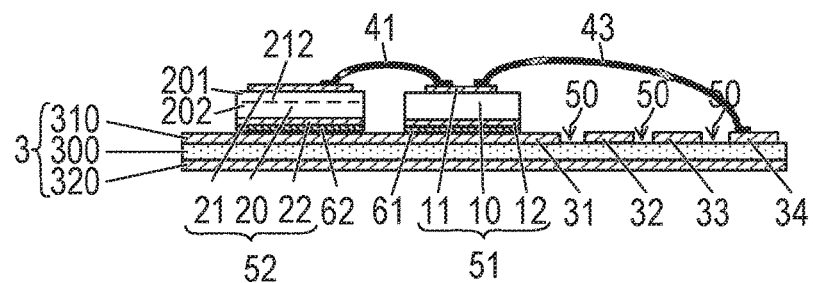
FIG. 9 is a cross-sectional side view in a cross-sectional plane A-A of a section shown in FIGS. 7 and 8.

FIG. 9 shows a cross-section of a section of the arrangement in a sectional plane A-A (see FIGS. 7 and 8). As illustrated in FIG. 9, each first semiconductor body $51_{nm}$ includes a semiconductor layer 10 and the first load electrode 11, the second load electrode 12 and the control electrode (not illustrated in FIG. 9) of the controllable sub-element $T5_{nm}$ integrated in the first semiconductor body $51_{nm}$. The second semiconductor body $52_{nm}$ includes a semiconductor layer 20, the first electrode 21 and the second electrode 22 of the freewheeling element $D5_{nm}$ integrated in the second semiconductor body $52_{nm}$. The semiconductor layer 10 may include a monocrystalline or substantially monocrystalline semiconductor material, e.g., silicon, silicon carbide, gallium nitride, gallium arsenide, aluminum gallium arsenide, or any other semiconductor material that can be used for semiconductor devices, and may have one or more semiconductor regions doped with electrically active dopants, i.e. with dopants causing the corresponding semiconductor region to be n-doped or p-doped. For example, the semiconductor layer 10 may include at least one pn-junction formed between a p-doped semiconductor region and an n-doped semiconductor region. In other constructions, e.g. in certain HEMTs (High Electron Mobility Transistor), however, the semiconductor layer 10 may be free of pn-junctions and/or free of electrically active dopants.

The design of the semiconductor layer 20 may be chosen independently from the design of the first semiconductor bodies $51_{nm}$. For instance, the semiconductor layer 20 may include a monocrystalline or substantially monocrystalline semiconductor material, e.g., silicon, silicon carbide, gallium nitride, gallium arsenide, aluminum gallium arsenide, or any other semiconductor material that can be used for semiconductor devices, and may have one or more semiconductor regions doped with electrically active dopants, i.e. with dopants causing the corresponding semiconductor region to be n-doped or p-doped. In other designs, however, the second semiconductor body 20 may be free of pn-junctions (e.g. in certain HEMTs or Schottky-diodes) and/or free of electrically active dopants (e.g. in certain HEMTs).

As described above, each of the first semiconductor bodies $51_{nm}$ includes an individual one of the multiplicity of identical controllable sub-elements $T5_{nm}$. Examples of suitable identical controllable sub-elements $T5_{nm}$ are, without being restricted to, unipolar or bipolar transistors, thyristors, or any other controllable semiconductor elements. In case of transistors, the identical controllable semiconductor elements may be, e.g., IGFETs (Insulated Gate Field Effect Transistors) like MOSFETs (Metal Oxide Semiconductor Field-Effect Transistors) or IGBTs (Insulated Gate Bipolar Transistors; e.g. reverse conducting IGBTs), or JFETs (Junction Field Effect Transistors), HEMTs, BIPs (Bipolar Transistors), or any other transistors.

Each of the identical first controllable sub-elements $T5_{nm}$ has a load path formed between the first load electrode $511_{nm}$ and the second load electrode $512_{nm}$, and a control input connected to the control electrode $513_{nm}$ for controlling the load path. As shown in FIG. 7, the first load electrode $511_{nm}$ of a first controllable sub-element $T5_{nm}$ may be a first contact pad of the respective first semiconductor body $51_{nm}$ the second load electrode $512_{nm}$ of that first controllable sub-element $T5_{nm}$ may be a second contact pad of the respective first semiconductor body $51_{nm}$, and the control electrode $513_{nm}$ of that first controllable sub-element $T5_{nm}$ may be a third contact pad of the respective first semiconductor body $51_{nm}$. The first electrode $521_n$ of the freewheeling elements $D5_n$ may be a first contact pad of the respective second semiconductor body $52_{nm}$ and the second electrode $522_{nm}$ of the respective freewheeling element $D5_n$ may be a second contact pad of the same second semiconductor body $52_{nm}$.

Depending on the type of controllable semiconductor element, the first load electrode $511_{nm}$ may be a source electrode or an emitter electrode, the second load electrode $512_{nm}$ may be a drain electrode or a collector electrode, and the control electrode $513_{nm}$ may be a gate electrode or a base electrode. In order to control such a controllable semiconductor sub-element $T5_{nm}$, a control signal (e.g., voltage and/or current) may be applied between the first load electrode $511_{nm}$ and the control (third) electrode $513_{nm}$. The control voltage may be referenced to the electrical potential of the first load electrode $511_{nm}$.

The first contact pads of the first semiconductor bodies $51_{nm}$ may be disposed at a side of the semiconductor layer 10 of the corresponding first semiconductor body $51_{nm}$ facing away from the electrically insulated carrier 3. Accordingly, the second contact pads of the first semiconductor bodies $51_{nm}$ may be disposed at a side of the semiconductor layer 10 of the corresponding first semiconductor body $51_{nm}$ facing towards the electrically insulated carrier 3. Further, the third contact pads of the first semiconductor bodies $51_{nm}$ may be disposed at a side of the semiconductor layer 10 of the corresponding first semiconductor body $51_{nm}$ facing away from the electrically insulated carrier 3.

The first contact pad of the second semiconductor body $52_{nm}$ is disposed at a side of the semiconductor layer 20 facing away from the electrically insulated carrier 3, and the second contact pad of the second semiconductor body $52_{nm}$ may be disposed at a surface of the semiconductor layer 20 facing towards the electrically insulated carrier 3.

The first, second and third contact pads of the first semiconductor bodies $51_{nm}$ and the first and second contact pads of the second semiconductor bodies $52_{nm}$ may be attached to the semiconductor layers 10, 20 of the corresponding semiconductor bodies $51_{nm}$, $52_{nm}$ before the corresponding semiconductor bodies $51_{nm}$, $52_{nm}$ are mounted onto the electrically insulated carrier 3.

The electrically insulated carrier 3 includes a dielectric insulation layer 300, a structured first metallization layer 310 attached to the dielectric insulation layer 300, and an optional second metallization layer 320 attached to the dielectric insulation layer 300. If there is a second metallization layer 320, the dielectric insulation layer 300 may be disposed between the first and second metallization layers 310, 320.

Each of the first and, if provided, second metallization layers 310, 320 may consist of or include, without being restricted to, one of the following materials: copper; a copper alloy; aluminum; an aluminum alloy; any other metal or alloy that remains solid during the operation of the semiconductor assembly. According to one example, the electrically insulated carrier 3 may be a ceramic substrate, that is, an electrically insulated carrier 3 in which the dielectric insulation layer 300 is a ceramic, e.g. a thin ceramic layer. The ceramic may, without being restricted to, consist of or include one of the following materials: aluminum oxide; aluminum nitride; zirconium oxide: silicon nitride: boron nitride; any other dielectric ceramic. For instance, the electrically insulated carrier 3 may, e.g., be a DCB substrate (DCB=Direct Copper Bonding), a DAB substrate (DAB=Direct Aluminum Bonding), or an AMB substrate (AMB=Active Metal Brazing). According to another example, the electrically insulated carrier 3 may be a conventional printed circuit board (PCB) having a non-ceramic dielectric insulation layer 300. For instance, a non-ceramic dielectric insulation layer 300 may consist of or include a cured resin. Irrespective of the materials of the first and second metallization layers 310, 320 and the insulation layer 300, the electrically insulated carrier 3 may be free of electrical connections (e.g. vias; via="vertical interconnect access") that pierce the insulation layer 300 and electrically interconnect the first and second metallization layers 310, 320.

The electrically insulated carrier 3 may include a first conductor trace 31, a second conductor trace 32, a third conductor trace 33, and a fourth conductor trace 34 disposed distant from one another. That is, each of the conductor traces 31, 32, 33, 34 is disposed distant from each of the other of the conductor traces 31, 32, 33, 34. Generally, each of the conductor traces 31, 32, 33, 34 may be a conductor trace of the electrically insulated carrier 3. As illustrated in FIG. 7, each of the conductor traces 31, 32, 33, 34 may be a section of the same metallization layer (here: the first metallization layer 310) of the electrically insulated carrier 3.

Figure 10:
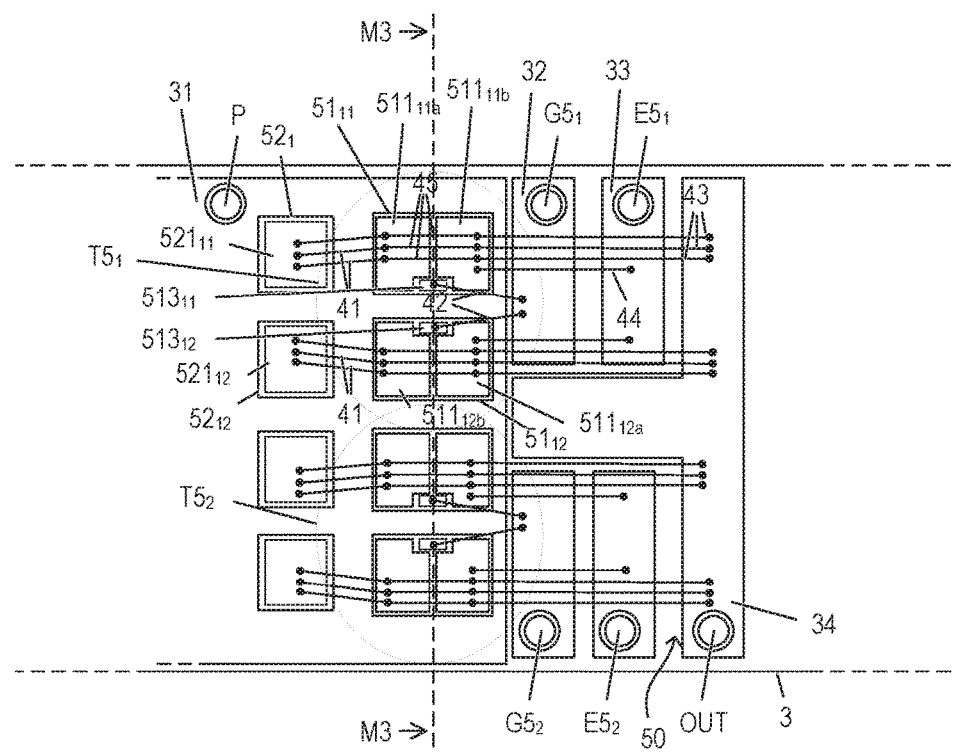
FIG. 10 is a top view illustrating another exemplary semiconductor arrangement.

Optionally, each of the multiplicity of identical first semiconductor bodies $51_{nm}$ and each of the multiplicity of identical second semiconductor bodies $52_{nm}$ may be disposed on the first conductor trace 31. Thereby, each of the first semiconductor bodies $51_{nm}$ may be electrically and mechanically connected to the first conductor trace 31 by an electrically conductive first connection layer 61 (FIG. 9) extending from the first conductor trace 31 to the second contact pad of the corresponding first semiconductor body $51_{nm}$ and/or the second semiconductor body $52_{nm}$ may be electrically and mechanically connected to the first conductor trace 31 by an electrically conductive second connection layer 62 (FIG. 9) extending from the first conductor trace 31 to the second contact pad of the second semiconductor body $52_{nm}$. As shown in FIGS. 7, 8 and 10, the design of the first metallization layer 310 may be such that it does not include a recess in the region(s) between the first semiconductor bodies $51_{nm}$ and the second semiconductor bodies $52_{nm}$. The absence of such recesses improves the heat spreading effect of the first metallization layer 310.

The first connection layer 61 may be a solder layer, a layer of an electrically conductive adhesive, or a layer of a sintered metal powder, e.g. a sintered silver powder, or any other suitable layer. Independently from the type of the first connection layer 61, the type of the second connection layer 62 may be a solder layer, a layer of an electrically conductive adhesive, or a layer of a sintered metal powder, e.g. a sintered silver powder, or any other suitable layer. Optionally, the first and second connection layers 61, 62 may be sections of a common connection layer and be of the same type, for instance one of the types mentioned before.

In order to facilitate the electrical connection of the electrically insulated carrier 3 to a supply voltage, to an electrical load, to a potential, or to a controller etc., the substrate arrangement may include electrical terminals P, $G5_n$, $E5_n$, OUT which may be mounted on the electrically insulated carrier 3. For instance, one or more (here: one) first electrical terminals P may be mounted on and electrically connected to the first conductor trace 31, one or more (here: one) second electrical terminals G2, may be mounted on and electrically connected to the second conductor trace 32, one or more (here: one) third electrical terminal $E5_n$ may be mounted on and electrically connected to the third conductor trace 33, and one or more (here: one) fourth electrical terminals OUT may be mounted on and electrically connected to the fourth conductor trace 34. The first, second and fourth electrical terminals P, $G5_n$ and OUT correspond to the common node P, the control node $G5_n$ and the output node OUT of the arrangement in FIGS. 1, 4A, 5 and 6 and, therefore, are denoted with the same reference signs. The third terminal $E5_1$ corresponds to the auxiliary emitter electrode $E5_1$ of the arrangement in FIG. 3 and is, therefore, denoted with the same reference sign. As has been explained before, the auxiliary emitter electrode $E5_1$ (and therefore the third conductor trace 33 and the third electrical terminal $E5_1$) is optional and may be omitted. In the illustrated example, the electrical terminals P, $G5_n$, $E5_n$, OUT are metallic sleeves for receiving electrically conductive pins. However, any other type of terminals may be used as well. Instead of the first, second, third or fourth terminals P, $G5_n$, $E5_n$, OUT mounted on and electrically connected to the first, second, third or fourth conductor traces 31, 32, 33, 34, the respective conductor traces 31, 32, 33, 34 themselves may form terminals. That is, separate terminals mounted on and electrically connected to the respective conductor traces may be omitted and the traces may serve as terminals.

As illustrated in FIG. 5, within one of the plurality of identical fifth controllable semiconductor subcomponents $T5_n$ (here: $T5_1$) the first electrode $521_n$ (here: $521_1$) of the freewheeling element $D5_n$ (here: $D5_1$) is electrically connected to the first load electrodes $511_{nm}$ (here: $511_{11}$, $511_{12}$) of each of the multiplicity of controllable sub-elements $T5_{nm}$ (here: $T5_{11}$, $T5_{12}$) via an individual one of a multiplicity of third branch lines $583_{nm}$ (here: $583_{11}$, $583_{12}$).

Referring again to FIG. 7, the first conductor trace 31 may serve to electrically interconnect the second load electrodes $512_{nm}$ (the second contact pads, here: $512_{11}$, $512_{12}$) of the first controllable sub-elements $T5_{nm}$ (here: $T5_{11}$, $T5_{12}$) integrated in the first semiconductor bodies $51_{nm}$ (here: $51_{11}$, $51_{12}$) and the second load electrodes $522_n$ (the second contact pad, here: $522_1$) of the respective freewheeling element $D5_n$ (here: $D5_1$) integrated in the second semiconductor body $52_n$ (here: $52_1$). The second conductor trace 32 may serve to electrically interconnect the control electrodes $513_{nm}$ (the third contact pad, here: $513_{11}$, $513_{12}$) of the multiplicity of controllable semiconductor subcomponents $T5_{11}$, $T5_{12}$ integrated in the first semiconductor bodies $51_{11}$, $51_{12}$, and the third conductor trace 33 may serve to electrically interconnect the auxiliary emitter electrodes $E5_n$ (see FIG. 3) of the multiplicity of fifth controllable semiconductor subcomponents $T5_n$ integrated in the first semiconductor bodies $51_{nm}$. The fourth semiconductor trace 34 may serve to electrically interconnect the first load electrodes $511_{11}$, $511_{12}$ (the first contact pads) of all first controllable sub-elements $T5_{11}$, $T5_{12}$ integrated in the first semiconductor bodies $51_{11}$, $51_{12}$. Further, the first conductor trace 31 and the fourth conductor trace 34 may serve to carry a load path current flowing through the electrically parallelized load paths of the multiplicity of fifth controllable semiconductor sub-elements $T5_{nm}$ integrated in the first semiconductor bodies $51_{nm}$. The second conductor trace 32 may serve to provide an electric control potential $V_{ctrl}$ to the control electrodes $513_{nm}$ (the third contact pads).

The control electrodes $513_{1m}$ of the multiplicity of controllable semiconductor sub-elements $T5_{1m}$ of a first one of the fifth controllable semiconductor subcomponents $T5_1$ may be electrically connected to a different conductor trace than the control electrodes $513_{2m}$ of the multiplicity of controllable semiconductor sub-elements $T5_{2m}$ of a second one of the fifth controllable semiconductor subcomponents $T5_2$.

As can be seen from FIGS. 4A and 5 in combination with FIG. 7, each of the individual first branch lines $583_{nm}$ electrically connecting the first load electrodes $511_{nm}$ (the first contact pads) of the respective first semiconductor bodies $51_{nm}$ with the first electrode $521_n$ of the freewheeling element $D5_n$ may include at least one bonding wire 41 that is, at respective bonding locations, wire-bonded directly to both the respective first load electrode $511_{nm}$ (the respective first contact pad) and the first electrode $521_n$ of the freewheeling element $D5_n$. In FIG. 7, the bonding locations at which a bonding wire is (wire) bonded to another element, are schematically illustrated by bold dots. A bonding wire is wire bonded at a bonding location to an electrically conductive element. The bonding wire directly contacts and forms a substance-to-substance-bond with the electrically conductive element at the bonding location so that the bonding wire and the electrically conductive element are electrically and mechanically connected at the bonding location. The provision of wire bonded connections, e.g. by ultrasonic wire bonding, is commonly known in the art so that no further explanation is required in this regard.

As can be seen from FIGS. 4A and 5 in combination with FIG. 7, each of the first output lines $581_{nm}$ electrically connecting the first load electrode $511_{nm}$ (the first contact pad) of the respective first semiconductor body $51_{nm}$ with the output node OUT may include at least one bonding wire 43 that is, at respective bonding locations, wire-bonded directly to both the first load electrode $511_{nm}$ (the first contact pad) of the respective first semiconductor body $51_{nm}$ and the fourth conductor trace 34.

Each of the first feed lines $585_{nm}$ electrically connecting the second load electrode $512_{nm}$ (the second contact pad) of the respective first semiconductor body $51_{nm}$ with the first common node P, may include a first connection layer 61 that electrically and mechanically interconnects the respective second load electrode $512_{nm}$ (the respective second contact pad) and the first conductor trace 31.

Each of the first connecting lines $584_n$ electrically connecting the second electrode $522_n$ (the second contact pad) of the respective second semiconductor body $52_n$ with the first common node P, may include a second connection layer 62 that electrically and mechanically interconnects the respective second electrode $522_n$ (the respective second contact pad) and the first conductor trace 31.

Each of the first control lines $582_{nm}$ electrically connecting the control electrode $513_{nm}$ (the third contact pad) of the respective first semiconductor body $51_{nm}$ with the control node $G5_n$ may include a least one bonding wire 42 that is, at respective bonding locations, wire-bonded directly to both the respective control electrode $513_{nm}$ (the respective third contact pad) and the second conductor trace 32.

Electrical lines electrically connecting the first load electrode $511_{nm}$ (the first contact pad) of the respective first semiconductor body $51_{nm}$ with an auxiliary emitter node $E5_n$ may include at least one bonding wire 44 that is, at respective bonding locations, wire-bonded directly to both the first load electrode $511_{nm}$ (the first contact pad) of the respective first semiconductor body $51_{nm}$ and the third conductor trace 33.

As described above, the first load electrode $511_{nm}$ of each of the multiplicity of first controllable sub-elements $T5_{nm}$ integrated in the first semiconductor bodies $51_{nm}$ is electrically connected to the first electrode $521_n$ of the second semiconductor body $52_n$ via an individual first branch line $583_{nm}$. The individual first branch lines $583_{nm}$ serve to apply an electric potential present at the first electrodes $521_{nm}$ to the first load electrodes $511_n$ (the first contact pads) of the first semiconductor bodies $51_n$.

According to an option illustrated in FIG. 5, an electrical connection between the first electrode $521_1$ of the freewheeling element $D5_1$ (the first contact pad of the second semiconductor body $52_1$) and the first load electrode $511_{11}$ of one of the first controllable sub-elements $T5_{11}$ (the first contact pad of one of the first semiconductor bodies $51_{11}$) and an electrical connection between the first load electrode $511_{11}$ of one of the first controllable sub-elements $T5_{11}$ (the first contact pad of one of the first semiconductor bodies $511_{11}$) and the fourth conductor trace 34 and/or the fourth electrical terminal OUT may be realized using a single connecting element, e.g. a bonding wire. For instance, one of the third branch lines $583_{nm}$ may be formed by a first section 41 of the bonding wire. Similarly, instead of providing a bonding wire 41 and a bonding wire 43 as separate bonding wires, there may be one bonding wire which is wire bonded to the first electrode $521_n$ of the second semiconductor body $52_n$, the first load electrode $511_{nm}$ of one of the first semiconductor bodies $51_{nm}$, and the fourth conductor trace 34. In FIG. 7, one such bonding wire is schematically illustrated using a dashed line joining a bonding wire 41 and a bonding wire 43 to form a single bonding wire. More generally, any chain in which two or more of the described bonding wires are electrically connected in series may be replaced by a single bonding wire having sections so that each of the sections forms a bonding wire connection that electrically connects the same elements as the corresponding replaced bonding wire.

As also illustrated in the example of FIG. 7, a bonding wire 41 may be wire bonded to the first electrode $521_n$ of the freewheeling element $D5_n$ (the first contact pad of the second semiconductor body $52_n$) at only one bonding location. Alternatively (not shown), a bonding wire 41 could also be wire bonded to the first electrode $521_n$ of the freewheeling element $D5_n$ (the first contact pad of the second semiconductor body $52_n$) at at least two bonding locations.

As can be seen from the examples explained with reference to FIGS. 5 and 7, each branch line $583_{nm}$ physically and electrically contacts the first electrode $521_n$ of the freewheeling element $D5_n$ integrated in the second semiconductor body $52_n$ (the first contact pad of the second semiconductor body $52_n$), whereas the output lines $581_{nm}$ may be distant from the first electrode $521_n$ (distant from the first contact pad of the second semiconductor body $52_n$). That is, an electric potential applied to the fourth conductor trace 34 (e.g. directly or via the fourth electrical terminal OUT) is transferred to all first electrodes $521_n$ via the first load electrodes $511_n$ of the first semiconductor bodies $51_{nm}$ and the respective output lines $581_{nm}$ and vice versa.

Even though the example illustrated in FIG. 7 shows only two first semiconductor bodies $51_{nm}$ for each controllable sub-element $T5_{nm}$, e.g., semiconductor bodies $51_{11}$ and $51_{12}$ for controllable sub-element $T5_{1m}$, it is to be noted that each controllable sub-element $T5_{nm}$ may include more than two first semiconductor bodies $51_{nm}$ (more than two first controllable sub-elements $T5_{nm}$) electrically connected in parallel. In this case, the first load electrodes $511_{nm}$ of more than two (even of each) of the first controllable sub-elements $T5_{nm}$ integrated in the first semiconductor bodies $51_{nm}$ may be connected to the same first electrode $521_n$ of the second semiconductor body $52_n$ analogously.

However, for some applications, providing only one freewheeling element $D5_n$ for each of the fifth controllable semiconductor subcomponents $T5_n$ may not provide satisfactory results with regard to switching characteristics and thermal performance. Therefore, each of the fifth controllable semiconductor subcomponents $T5_n$ may include more than one freewheeling element $D5_{nm}$. This will be described further in the following.

Figure 6:
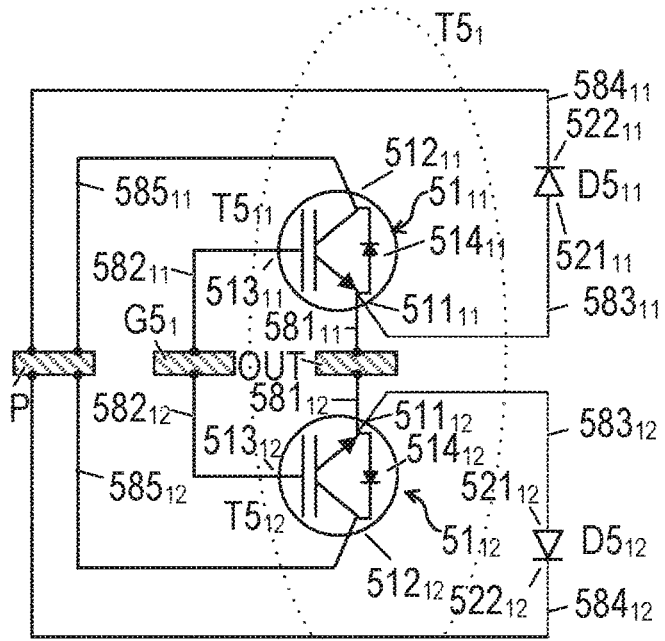
FIG. 6 is a circuit diagram of a section of the semiconductor arrangement of FIG. 4A.

FIG. 6 illustrates a further example of a semiconductor arrangement which provides improved switching characteristics and an improved thermal performance. The semiconductor arrangement of FIG. 6 is based on the semiconductor arrangement of FIG. 5 with the difference, that the semiconductor arrangement of FIG. 6 includes more than one (here: two) freewheeling element $D5_{nm}$ (instead of only one as shown in FIG. 5). The number of freewheeling elements $D5_{nm}$ in FIG. 6 is the same as the number of controllable sub-elements $T5_{nm}$ (here: two). The first electrode $521_{nm}$ of each freewheeling element $D5_{nm}$ is electrically connected to one first load electrode $511_{nm}$ of one of the first controllable sub-elements $T5_{nm}$ via an individual one of a multiplicity of separate third branch lines $583_{nm}$. The second electrode $522_{nm}$ of each freewheeling element $D5_{nm}$ is electrically connected to the first common node P via an individual one of a multiplicity of separate third connecting lines $584_{nm}$.

FIG. 8 schematically illustrates a semiconductor arrangement that includes an exemplary assembled electrically insulated carrier 3, e.g. a circuit board, a substrate or switch plate. In FIG. 8, only a relevant section of the assembled electrically insulated carrier 3 is illustrated. The semiconductor arrangement may include a circuit as illustrated in FIG. 4A. The semiconductor arrangement may also include additional semiconductor devices (e.g., the semiconductor devices that are necessary to form the arrangement of FIGS. 1 and 3), such semiconductor devices, however, are not illustrated in FIG. 8 for clarity reasons. As illustrated in FIG. 8, the semiconductor arrangement essentially corresponds to the semiconductor arrangement that is illustrated in FIG. 7. In the semiconductor arrangement of FIG. 8, however, each fifth controllable semiconductor subcomponent $T5_n$ (here:

$T5_1$ and $T5_2$) includes, disposed in each case on the electrically insulated carrier 3 (e.g. on the same surface of the electrically insulated carrier 3), a multiplicity of first semiconductor bodies $51_{nm}$ and a multiplicity of second semiconductor bodies $52_{nm}$, wherein the number of first semiconductor bodies $51_{nm}$ equals the number of second semiconductor bodies $52_{nm}$ (here: two). Each of the multiplicity of first semiconductor bodies $51_{nm}$ is electrically connected to a different one of the multiplicity of second semiconductor bodies $52_{nm}$ via a multiplicity of separate branch lines $583_{nm}$. Each of the individual branch lines $583_{nm}$ electrically connecting the first load electrodes $511_{nm}$ (the first contact pads) of the respective first semiconductor bodies $51_{nm}$ with the first electrode $521_n$ of one of the freewheeling elements $D5_{nm}$ may include at least one bonding wire 41 that is, at respective bonding locations, wire-bonded directly to both the respective first load electrode $511_{nm}$ (the respective first contact pad) and the first electrode $521_{nm}$ of the freewheeling element $D5_{nm}$.

Each of the multiplicity of second semiconductor bodies $52_{nm}$ of each fifth controllable semiconductor subcomponent $T5_n$ includes one of the plurality of freewheeling elements $D5_{nm}$. The first electrode $521_{nm}$ and the second electrode $522_{nm}$ of each freewheeling element $D5_{nm}$ may also be electrodes (pads) of the corresponding second semiconductor bodies $52_{nm}$. In the example illustrated in FIG. 8, all first semiconductor bodies $51_{nm}$ may be structurally identical, e.g., of an identical construction with identical electrical properties. Further, all second semiconductor bodies $52_{nm}$ may be structurally identical, e.g., of an identical construction with identical electrical properties. The second semiconductor bodies $52_{nm}$, however, are structurally different from the first semiconductor bodies $51_{nm}$.

The design of the mentioned elements can be adapted to achieve desired electrical properties like identical ohmic behaviors, identical inductive behaviors and identical capacitive behaviors. In one example, each fifth controllable semiconductor subcomponent $T5_n$ is adapted to achieve desired electrical properties like identical ohmic behavior, identical inductive behavior and identical capacitive behavior. In a further example, additionally each controllable sub-element $T5_{nm}$ is adapted to achieve desired electrical properties like identical ohmic behavior, identical inductive behavior and identical capacitive behavior.

Within each fifth controllable semiconductor subcomponent $T5_n$, the first electrode $521_{nm}$ of each of the multiplicity (here: of two) of freewheeling elements $D5_{nm}$ is, e.g. through one or more bonding wires 41 or any other electrical connection, electrically connected to a first load electrode $511_{nm}$ of the first controllable sub-element $T5_{nm}$ integrated in a first one of the first semiconductor bodies $51_{nm}$. Correspondingly, the first load electrode $511_{nm}$ of each of the multiplicity (here: of two) of first controllable sub-elements $T5_{nm}$ is, e.g. through one or more bonding wires 43 or any other electrical connection, electrically connected to the fourth conductor trace 34.

As can be seen from FIG. 8, the first load electrode $511_{nm}$ of each of the first semiconductor bodies $51_{nm}$ is electrically connected via a third branch line $583_{nm}$ (see FIG. 6) to the first electrode $521_{nm}$ of a different second semiconductor body $52_{nm}$. The first load electrode $511_{nm}$ of each of the first semiconductor bodies $51_{nm}$ is further electrically connected via a third output line $581_{nm}$ (see FIG. 6) to the fourth conductor trace 34. The third branch lines $583_{nm}$ serve to apply a potential at the first electrodes $521_{nm}$ of each of the multiplicity of the freewheeling elements $D5_{nm}$ resulting from the switching sequence of the controllable semiconductor main-elements T1-T6, to the first load electrodes $511_{nm}$ of each of the multiplicity of the first controllable sub-elements $T5_{nm}$. The third output lines 581, serve to apply a potential at the first load electrodes $511_{nm}$ of each of the multiplicity of the first controllable sub-elements $T5_{nm}$ resulting from the switching sequence of the controllable semiconductor main-elements T1-T6, to the fourth conductor trace 34 and/or to the fourth electrical terminal OUT. In order to prevent differences between the voltages that occur directly at the places of the individual first semiconductor bodies $51_{nm}$, all third branch lines $583_{nm}$ may be configured to provide identical voltage and current transfers. Separate electrical lines are configured to provide an identical voltage and current transfer if, for each signal that is transferred via each of the separate electrical lines, the separate electrical lines transfer (if there is a distortion: distort) the signal in the same manner. As a result, the (transferred) signals are identical at any time. This means, with regard to the third branch lines $583_{nm}$, that the voltages between the first electrodes $521_{nm}$ and the second electrodes $522_{nm}$ of the freewheeling elements $D5_{nm}$ integrated in the individual second semiconductor bodies $52_{nm}$ are identical at any time, and that the currents through the separate third branch lines $583_{nm}$ are identical or substantially identical at any time. That is, the time-dependent behavior of the voltages between the first electrodes $521_{nm}$ and the second electrodes $522_{nm}$ are identical and synchronous for all freewheeling elements $D5_{nm}$.

In order to achieve separate electrical lines configured to provide an identical voltage and current transfer, the separate electrical lines may be designed to have at least one of: identical ohmic behaviors, identical inductive behaviors and identical capacitive behaviors. Generally, an electrical line may consist of or include one or more of the following electrically conductive elements: a wire (e.g. a bonding wire), a single metal sheet, a metal bar, a conductor trace of an electrically insulated carrier, a solder layer, a layer of sintered metal powder, an electrically conductive adhesive, or it may consist of or include any combination with two or more of the mentioned elements. In case of the two or more electrically conductive elements, the elements may be electrically connected in parallel and/or in series. In the illustrated examples, one or more bonding wires (e.g. bonding wires) and conductor traces of an electrically insulated carrier 3 are used. The design of the mentioned elements can be adapted to achieve desired electrical properties like identical ohmic behaviors, identical inductive behaviors and identical capacitive behaviors.

For instance, two electrically conductive elements may be designed to provide an identical voltage and current transfer if they are identical (e.g. have, inter alia, identical shapes, identical lengths, identical cross-sectional areas, identical materials or material compositions, etc.) and/or have a geometrically symmetrical design (e.g. mirror-symmetrical, point-symmetrical, rotational-symmetrical, etc.) relative to one another. However, also non-identical and/or non-symmetrical electrically conductive elements may be designed to have at least one of: identical ohmic behaviors, identical inductive behaviors; identical capacitive behaviors. For instance, a desired ohmic resistance of an electrically conductive element may be adjusted by appropriately selecting its cross-section, its length, the electrical resistivity of the material used for the elements, etc. A desired inductivity of an electrically conductive element may be adjusted by appropriately selecting e.g. the shape and the length of the element. For instance, the inductivity of a straight wire may be increased if the wire is distorted, e.g. curved or wound to a coil. Desired capacitive properties of an electrically conductive element may be adjusted by appropriately selecting e.g. its shape, its length and its course. Because the ohmic resistance, the inductivity and the capacitive properties of a single electrically conductive element can be adjusted as described, the ohmic behavior, the inductive behavior and the capacitive behavior of a conductive line consisting of a single electrically conductive element or of a combination of at least two electrically interconnected electrically conductive elements can be adjusted as well.

According to the examples illustrated in FIGS. 7 and 8, the individual third output lines $581_{nm}$ (see FIGS. 4, 5 and 6), each formed by, without being restricted to, one bonding wire or more bonding wires 43 electrically connected in parallel between the same first load electrode $511_{nm}$ of the controllable sub-element $T5_{nm}$ integrated in a first semiconductor body $51_{nm}$ (i.e. the same first contact pad of the first semiconductor $51_{nm}$) and the fourth conductor trace 34 may be identical, and/or geometrically symmetrical (e.g. mirror-symmetrical and/or rotational-symmetrical) to one another. FIGS. 7 and 8 show two third output lines $581_{nm}$ within each fifth controllable semiconductor subcomponent $T5_n$, each consisting of three bonding wires 43. The two third output lines $581_{nm}$ are mirror-symmetric to one another relative to a mirror-plane M11-M11.

FIG. 7 shows two third branch lines $583_{nm}$ within each of the fifth controllable semiconductor subcomponents $T5_n$, each third branch line $583_{nm}$ consisting of two bonding wires 41. The two third branch lines $583_{nm}$ of each fifth controllable semiconductor subcomponent $T5_n$ are mirror-symmetric to one another relative to a mirror-plane M11-M11. In FIG. 7, each third branch line $583_{nm}$ electrically connects the second semiconductor body $52_n$ with each of the first semiconductor bodies $51_n$. FIG. 8 also shows two third branch lines $583_{nm}$ within each fifth controllable semiconductor subcomponent $T5_n$, each third branch line $583_{nm}$ consisting of two bonding wires 41. The two third branch lines $583_{nm}$ of each fifth controllable semiconductor element $T5_n$ are mirror-symmetric to one another relative to the mirror-plane M11-M11. In FIG. 8, however, each third branch line $583_{nm}$ electrically connects an individual one of the second semiconductor bodies $52_n$ with an individual one of the first semiconductor bodies $51_n$.

Optionally, the third control lines $582_{nm}$ (see FIGS. 5 and 6) electrically connecting the second electrical terminal $G5_n$ and/or the second conductor trace 32 to the control electrodes $513_{nm}$ of the multiplicity of controllable sub-elements $T5_{nm}$ of a first one $T5_1$ of the fifth controllable semiconductor subcomponents $T5_n$ may also be configured to provide an identical voltage and current transfer. When regarding the second conductor trace 32 as "second electrical terminal $G5_1$", each of the third control lines $582_{nm}$ in FIGS. 4 to 8 is formed by, without being restricted to, one bonding wire 42 or more bonding wires 42 electrically connected between the control electrode $513_{nm}$ of the respective first controllable sub-element $T5_{nm}$ and the second conductor trace 32. The third control lines $582_{nm}$ may be identical, and/or symmetrical (e.g. mirror-symmetrical and/or rotational-symmetrical) to one another. FIGS. 7 and 8 show two third control lines $582_{nm}$ within a first one (here: $T5_1$) of the fifth controllable semiconductor subcomponents $T5_n$ each consisting of one bonding wire 42. The two third control lines $582_{nm}$ are mirror-symmetric to one another relative to the mirror-plane M11-M11. FIGS. 7 and 8 also show two fourth control lines $582_{nm}$ within a second one (here: $T5_2$) of the fifth controllable semiconductor subcomponents $T5_n$ each consisting of one bonding wire 42. The two fourth control lines $582_{nm}$ are mirror-symmetric to one another relative to a mirror-plane M12-M12.

The two third control lines $582_{nm}$ of the first one (here: $T5_1$) of the fifth controllable semiconductor subcomponents $T5_n$ are mirror-symmetric to the two fourth control lines $582_{nm}$ of the second one (here $T5_2$) of the fifth controllable semiconductor subcomponents $T5_n$ relative to the mirror-plane M2-M2 (see FIGS. 7 and 8), the two third branch lines $583_{nm}$ of the first one (here: $T5_1$) of the fifth controllable semiconductor subcomponents $T5_n$ are mirror-symmetric to the two fourth branch lines $583_{nm}$ of the second one (here $T5_2$) of the fifth controllable semiconductor subcomponents $T5_n$ relative to the mirror-plane M2-M2 (see FIGS. 7 and 8) and the two third output lines $581_{nm}$ of the first one (here: $T5_1$) of the fifth controllable semiconductor subcomponents $T5_n$ are mirror-symmetric to the two fourth output lines $581_{nm}$ of the second one (here $T5_2$) of the fifth controllable semiconductor subcomponents $T5_n$ relative to the mirror-plane M2-M2 (see FIGS. 7 and 8).

In the arrangements of FIGS. 7 and 8, two individual fifth controllable semiconductor subcomponents $T5_1$, $T5_2$ are illustrated. The two individual fifth controllable semiconductor subcomponents $T5_1$, $T5_2$ are mirror-symmetric to one another relative to the mirror-plane M2-M2. The electrically conductive elements within the two fifth controllable semiconductor subcomponents $T5_1$, $T5_2$ may be designed identical to provide an identical voltage and current transfer (e.g. have, inter alia, identical shapes, identical lengths, identical cross-sectional areas, identical materials or material compositions, etc.) and/or have a geometrically symmetrical design (here: mirror-symmetrical) relative to one another. Further, the electrical connections between the elements in a first one of the fifth controllable semiconductor subcomponents $T5_1$ may be designed identical to the electrical connections between the elements in the second one of the fifth controllable semiconductor subcomponents $T5_2$. For example, the electrical connections may be designed identical to provide an identical voltage and current transfer (e.g. have, inter alia, identical shapes, identical lengths, identical cross-sectional areas, identical materials or material compositions, etc.) and/or have a geometrically symmetrical design (here: mirror-symmetrical with respect to mirror-plane M2-M2) relative to one another.

Furthermore, each of the fifth controllable semiconductor subcomponents $T5_n$ may be symmetrical in itself (here: mirror-plane M11-M11 for fifth controllable semiconductor subcomponents $T5_1$ and mirror-plane M12-M12 for fifth controllable semiconductor subcomponent $T5_2$).

Optionally, the third connecting lines $584_{nm}$ (see FIG. 6) electrically connecting the first electrical terminal P and/or the first conductor trace 31 to the second electrode(s) $522_{nm}$ may be configured to provide an identical voltage and current transfer. As can be seen in FIGS. 7 and 8 in combination with FIG. 9, each of the third connecting lines $584_{nm}$ may include a section of the first conductor trace 31 and the electrically conductive second connection layer 62. Also optionally, the third feed lines $585_{nm}$ (see FIG. 6) electrically connecting the first electrical terminal P and/or the first conductor trace 31 to the second load electrodes $512_{nm}$ of the multiplicity of controllable sub-elements $T5_{nm}$ may include a section of the first conductor trace 31 and the electrically conductive first connection layer 61.

Figure 11:
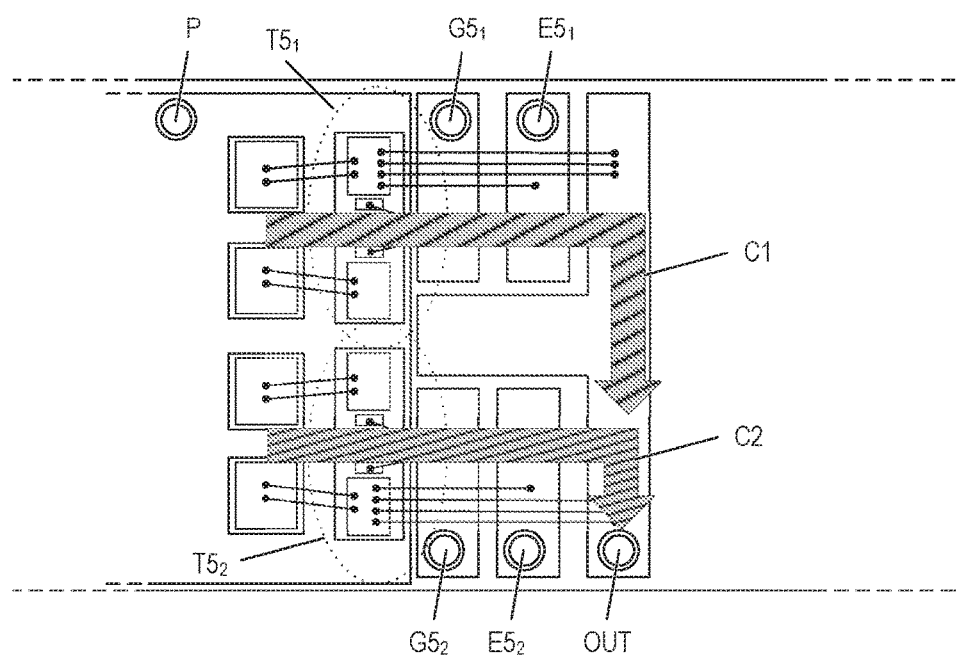
FIG. 11 is a top view schematically illustrating commutation paths in an exemplary semiconductor arrangement

The above results in essentially uniform (main) commutation paths. The switching losses are distributed essentially equally between the individual semiconductor subcomponents and sub-elements. This results in a uniform heating of the arrangement. Uniform commutation paths are schematically illustrated in the arrangement in FIG. 11. Resulting from the identical voltage and current transfers and/or the geometrically symmetrical design, the commutation paths C1, C2 extend midway between the two controllable sub-elements $T5_{nm}$ of the individual fifth controllable semiconductor subcomponents $T5_n$. Therefore, each of the individual first semiconductor bodies $51_{nm}$ has to sustain the same switching losses and the same temperatures. This may apply to the individual first semiconductor bodies $51_{nm}$ within one and the same fifth controllable semiconductor subcomponent $T5_n$, e.g., one first semiconductor body $51_{11}$ within a first fifth controllable semiconductor subcomponent $T5_1$ may have to sustain the same switching losses and the same temperatures as another first semiconductor body $51_{12}$ within the same fifth controllable semiconductor subcomponent $T5_1$. The above may further apply to the individual first semiconductor bodies $51_{nm}$ within different fifth controllable semiconductor subcomponent $T5_n$, e.g., one first semiconductor body $51_{11}$ within a first fifth controllable semiconductor subcomponent $T5_1$ may have to sustain the same switching losses and the same temperatures as another first semiconductor body $51_{21}$ within the another one of the fifth semiconductor subcomponents $T5_2$.

As exemplarily illustrated in FIGS. 7, 8 and 9, forming first, second, third and fourth conductor traces 31, 32, 33, 34 in the first metallization layer 310 may require the formation of recesses 50 between adjacent conductor traces 31, 32, 33, 34. Such recesses 50, however, reduce the heat spreading effect of the first metallization layer 310. Therefore, using a design in which each of the electrical connections between the first electrodes $521_{nm}$ and the fourth conductor traces 34 and/or between the first load electrodes $511_{nm}$ and the fourth electrical terminal OUT is electrically and physically led via the first load electrode $511_{nm}$ of at least one first semiconductor body $51_{nm}$, allows for reducing the number and/or length of conductor traces accompanied by unnecessary recesses 50 in the first metallization layer 310 so that the heat spreading effect of the first metallization layer 310 and, therefore, the heat spreading effect of the electrically insulated carrier 3 is increased.

Referring to FIG. 10, each first semiconductor body $51_{nm}$ may include more than one controllable sub-element $T5_{nm}$. As is illustrated in FIG. 10, each first semiconductor body $51_{nm}$ may include two controllable sub-elements $T5_{nm}$. Two controllable sub-elements $T5_{nm}$ sharing one first semiconductor body $51_{nm}$ may each have a first load electrode $511_{nmx}$ and a second load electrode $512_{nmx}$. They may, however, share one single control electrode $513_{nm}$. The electrical connection between the control electrode $513_{nm}$ and the second conductor trace 32 may include one or more bonding wires 42, as has been described with reference to FIGS. 7 and 8 above. An electrical connection between the first electrode $521_{nm}$ of a freewheeling element $D5_{nm}$ and a first semiconductor body $51_{nm}$ may include one or more bonding wires 41 between the first electrode $521_{nm}$ of the freewheeling element $D5_{nm}$ (e.g., $D5_{11}$) and the first load electrode $511_{nm}$ (e.g., $511_{11a}$) of a first controllable sub-element $T5_{1m}$ (e.g., $T5_{11}$), similar to the electrical connections as described with respect to FIGS. 7 and 8 before. An electrical connection between the fourth conductor trace 34 and the first semiconductor body $51_{nm}$ may include one or more bonding wires 43 between the fourth conductor trace 34 and the first load electrode $511_{nmx}$ of the other one of the first controllable sub-elements $T5_{1mx}$ (e.g., $511_{11b}$), integrated in the first semiconductor body $51_{nm}$, similar to the electrical connections as described with respect to FIGS. 7 and 8 before. Further, an electrical connection between the first load electrode $511_{nmx}$ of one of the controllable sub-elements $T5_{nmx}$ integrated in a first semiconductor body $51_{nm}$ and the first load electrode $511_{nmx}$ of the other one of the first sub-elements $T5_{nmx}$ integrated in the same first semiconductor body $51_{nm}$ may include one or more bonding wires 45. In another example, a continuous bonding wire connects the first electrode $52_{nm}$ of a second semiconductor body $52_{nm}$ with the first load electrode of one of the controllable sub-elements $T5_{nmx}$ integrated in a first semiconductor body $51_{nmx}$ further to the first load electrode $511_{nmx}$ of the other one of the first sub-elements $T5_{nmx}$ integrated in the same first semiconductor body $51_{nm}$ and further to the fourth conductor trace 34.

Optionally, each of the first controllable sub-elements $T5_{nm}$ included in the first semiconductor bodies $51_{nm}$ may include an integrated, e.g. intrinsic, freewheeling element $514_{nm}$ (see FIGS. 4 to 6) electrically connected between the first load electrode $511_{nm}$ and the second load electrode $512_{nm}$ of the corresponding first controllable sub-element $T5_{nm}$. If the first controllable sub-elements $T5_{nm}$ are RC-MOSFETs or RC-IGBTs (RC=reverse conducting), the integrated freewheeling elements $514_{nm}$ may be body diodes of the respective first controllable sub-element $T5_{nm}$. If the load paths of the first controllable sub-elements $T5_{nm}$ can (via the corresponding control electrode $513_{nm}$) be controlled and a reverse current can flow between the first and second load electrodes $511_{nm}$, $512_{nm}$ through the load path, the first controllable sub-element $T5_{nm}$ has a controllable reverse conductivity. Suitable first controllable sub-elements $T5_{nm}$ having a controllable reverse conductivity are, e.g., JFETs or HEMTs.

Even though the first controllable sub-elements $T5_{1m}$ included in the first semiconductor bodies $51_{1m}$ may have an internal, e.g. intrinsic, freewheeling element $514_{1m}$ that can be used for a freewheeling operation, one or more second semiconductor bodies $521_{nm}$ each including a freewheeling element $D5_{nm}$ may be provided as described above so that the freewheeling operation can make use of both the freewheeling operation of intrinsic or controllable reverse conductivities of the first controllable sub-elements $T5_{1m}$ included in the first semiconductor bodies $51_{1m}$ and a freewheeling element $D5_{1m}$ included in a second semiconductor body $52_{1m}$. One advantage of such a design is that the arrangement's electrical losses occurring during the freewheeling operation can at least partly be shifted from the first semiconductor bodies $51_{1m}$ to the freewheeling element(s) $D5_{1m}$ integrated in the second semiconductor body(s) $52_{1m}$. If (e.g. SiC-based) controllable sub-elements $T5_{1m}$ are employed. e.g. in a power factor correction (PFC) unit and/or in a boost converter, the freewheeling element $D5_{1m}$ (e.g. a Si-diode) integrated in one or more second semiconductor bodies $52_{1m}$ serves to protect the freewheeling elements $514_{1m}$ integrated in the first semiconductor bodies $51_{1m}$, when the controllable sub-elements $T5_{1m}$ integrated in the first semiconductor bodies $51_{1m}$ are operated in a reverse operation without controlled commutation, against an overload of the freewheeling elements $514_{1m}$ integrated in the first semiconductor bodies $51_{1m}$.

For instance, intrinsic reverse conductivities of controllable sub-elements $T5_{1m}$, in particular of unipolar controllable sub-elements $T5_{1m}$ and/or of controllable sub-elements $T5_{1m}$ having an internal body diode, are comparatively low as compared to the forward conductivities of available low-loss diodes (e.g. a low-loss diode having a rectifying pn- or Schottky junction 212 with a low forward voltage, e.g., a silicon (Si)-based diode having a Si-based semiconductor body 20) that may be integrated in a second semiconductor body $521_{1m}$ as a freewheeling element $D5_{1m}$. Further, the complexity of a controller required for controlling the first semiconductor bodies $51_{1m}$ may be reduced because there is no sophisticated controlled freewheeling operation of the first semiconductor bodies $51_{nm}$ required.

If the reverse conductivities of the controllable sub-elements $T5_{1m}$ are caused by body diodes of the controllable sub-elements $T5_{1m}$, the losses that occur during the freewheeling operation in the body diodes $514_{nm}$ are substantially determined by the forward voltages of the body diodes. Therefore, using a diode as the freewheeling element $D5_{1m}$ having a first forward voltage lower than a second forward voltage of the body diode(s) of the controllable sub-elements $T5_{1m}$ may significantly reduce the losses that occur during the operation of the semiconductor arrangement.

As explained above, at least one (optionally: each) of the at least one second semiconductor bodies $52_{nm}$ includes a freewheeling (flyback) element $D5_{nm}$. A freewheeling element $D5_{nm}$ is in a blocking state or can be switched into a blocking state (in a blocking state, an electrical path between the first electrode $521_{nm}$ and the second electrode $522_{nm}$ is blocking) when a voltage, which allows for an operation of the first semiconductor bodies $51_{nm}$ in the forward direction of the first semiconductor bodies $51_{nm}$, is applied between the first load electrodes $511_{nm}$ and second load electrodes $512_{nm}$ (and, therefore, between the first electrode $521_{nm}$ and the second electrode $522_{nm}$). Further, a freewheeling element $D5_{nm}$ is in a conductive state or can be switched into a conductive state (in a conductive state, an electrical path between the first electrode $521_{nm}$ and the second electrode $522_{nm}$ is conductive) when a reverse voltage is applied between the first load electrodes $511_{nm}$ and second load electrodes $512_{nm}$ (and, therefore, between the first electrode $521_{nm}$ and the second electrode $522_{nm}$).

As illustrated in FIG. 9, a second semiconductor body 52 which includes a freewheeling element $D5_{nm}$ may include a rectifying junction 212. According to the example illustrated in connection with FIG. 9, such a rectifying junction 212 may be a pn-junction formed between a first semiconductor region 201 of the second semiconductor body 52 and a second semiconductor region 202 of the second semiconductor body 52. The first semiconductor region 201 has a first conduction type (here: p), and the second semiconductor region 202 may have a second conduction type (here: n) complementary to the first conduction type. The first conduction type is, as illustrated in FIG. 9, 'p' and the second conduction type is 'n' if the forward operation of the controllable sub-elements $T5_{nm}$ integrated in the first semiconductor bodies 51 requires an electrical potential of the second load electrode(s) $512_{nm}$ to be positive relative to an electrical potential of the first load electrode(s) $511_{nm}$. Conversely, if the forward operation of the controllable sub-elements $T5_{nm}$ integrated in the first semiconductor bodies $51_{nm}$ requires an electrical potential of the second load electrode(s) $512_{nm}$ to be negative relative to an electrical potential of the first load electrode(s) $511_{nm}$, the first conduction type is 'n' and the second conduction type is 'p'.

As an alternative to a pn-junction, a rectifying junction 212 may be a Schottky-junction. If the forward operation of the controllable sub-elements $T5_{nm}$ integrated in the first semiconductor bodies $51_{nm}$ requires an electrical potential of the second load electrodes $512_{nm}$ to be positive relative to an electrical potential of the first load electrodes $511_{nm}$, the second semiconductor bodies $521_{nm}$ may include an n-doped semiconductor region which adjoins the first electrode $521_{nm}$ forming a rectifying Schottky-junction, and which adjoins the second electrode $522_{nm}$ forming an ohmic contact. Conversely, if the forward operation of the controllable sub-elements $T5_{nm}$ integrated in the first semiconductor bodies $51_{nm}$ requires an electrical potential of the second load electrodes $512_{nm}$ to be negative relative to an electrical potential of the first load electrodes $511_{nm}$ the second semiconductor bodies 52 may include an n-doped semiconductor region which adjoins the second electrode $522_{nm}$ forming a rectifying Schottky-junction, and which adjoins the first electrode $521_{nm}$ forming an ohmic contact.

As explained above, a freewheeling element $D5_{nm}$ may be a diode, e.g. a pn-diode or a Schottky-diode, integrated in a second semiconductor body $52_{nm}$ and electrically connected between the first electrode $521_{nm}$ and the second electrode $522_{nm}$ of the respective second semiconductor body $52_{nm}$. Alternatively to a diode, the freewheeling element $D5_{nm}$ integrated in a second semiconductor body $52_{nm}$ explained with reference to the previous figures may be a controllable semiconductor element. Such a controllable freewheeling semiconductor element $D5_{nm}$ may be operated such that it is in a blocking state or is switched into a blocking state when a voltage, which allows for an operation of the parallelized first semiconductor bodies $51_{nm}$ in the forward direction of the first semiconductor bodies $51_{nm}$, is applied between the first load electrodes $511_{nm}$ and second load electrodes $512_{nm}$ (and, therefore, between the first electrode $521_{nm}$ and the second electrode $522_{nm}$), and which is in a conductive state or is switched into a conductive state when a reverse voltage is applied between the first load electrodes $511_{nm}$ and the second load electrodes $512_{nm}$ (and, therefore, between the first electrode $521_{nm}$ and the second electrode $522_{nm}$). For instance, a freewheeling element $D5_{nm}$ formed as a controllable semiconductor element may be, without being restricted to, an IGFET (Insulated Gate Field Effect Transistor) like a MOSFET (Metal Oxide Semiconductor Field-Effect Transistor) or an IGBT (Insulated Gate Bipolar Transistor: e.g. a reverse conducting IGBT), a JFET, a HEMT, or any other suitable controllable semiconductor element.

Alternatively or additionally to an operation as a freewheeling element $D5_{nm}$, such a controllable semiconductor switch integrated in a second semiconductor body $52_{nm}$ may be operated such that its load path formed between the first and second electrodes $521_{nm}$ and $522_{nm}$ is blocking during a normal operation of the controllable sub-elements $T5_{nm}$ integrated in the first semiconductor bodies $51_{nm}$, and that its load path is switched to a fully or at least partly conductive state in response to a detected overload of at least one of the controllable sub-elements $T5_{nm}$ integrated in the first semiconductor bodies $51_{nm}$. For instance, the detected overload may be a detected excess voltage across the first and second load electrodes $511_{nm}$, $512_{nm}$ of a first semiconductor body $51_{nm}$, and/or a detected excess temperature of a first semiconductor body $51_{nm}$.

The following table shows examples of combinations of controllable sub-elements $T5_{nm}$ and freewheeling element(s) $D5_{nm}$. However, it should be pointed out that the disclosure is not restricted to the mentioned combinations.

| Controllable sub-elements $T5_{nm}$ | | Freewheeling element(s) $D5_{nm}$ | |
| --- | --- | --- | --- |
| first semiconductor bodies 10 | type | second semiconductor body/bodies 20 | type |
| SiC-based | MOSFET or IGBT or RC-IGBT | Si-based | pn-junction diode |
| Si-based | MOSFET or IGBT or RC-IGBT | Si-based | pn-junction diode |

-continued

| Controllable sub-elements T5$_{nm}$ | | Freewheeling element(s) D5$_{nm}$ | |
|---|---|---|---|
| first semiconductor bodies 10 | type | second semiconductor body/bodies 20 | type |
| SiC-based | MOSFET or IGBT or RC-IGBT | non-Si-based | pn-junction diode |
| Si-based | MOSFET or IGBT or RC-IGBT | non-Si-based | pn-junction diode |
| SiC-based | MOSFET or IGBT or RC-IGBT | any | Schottky-diode |
| Si-based | MOSFET or IGBT or RC-IGBT | any | Schottky-diode |
| GaN-based | HEMT | Si-based | pn-junction diode |
| GaN-based | HEMT | non-Si-based | pn-junction diode |
| GaN-based | HEMT | any | Schottky-diode |

Everything that has been described with respect to a first one T5$_1$ of the multiplicity of fifth controllable semiconductor subcomponents T5$_n$ is applicable, mutatis mutandis, to the other ones (here: T5$_2$) of the multiplicity of controllable semiconductor subcomponents T5$_n$. Everything that has been described with respect to the multiplicity of fifth controllable semiconductor subcomponents T5$_n$ is applicable, mutatis mutandis, to the multiplicity of sixth controllable semiconductor elements T6$_n$ or to a plurality of controllable semiconductor subcomponents of any other controllable semiconductor main-element T1, T2, T3, T4.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor arrangement, comprising:
a first supply node configured to be operatively connected to a first electrical potential;
a second supply node configured to be operatively connected to a second electrical potential;
a third supply node configured to be operatively connected to a third electrical potential, the first electrical potential being positive with reference to the second electrical potential and the third electrical potential being negative with reference to the second electrical potential;
a first controllable semiconductor main-element and a second controllable semiconductor main-element each having a control electrode and a controllable load path between two load electrodes, the load paths being operatively connected in series and between the first supply node and the second supply node, the first controllable semiconductor main-element and the second semiconductor main-element being connected with each other via a first common node;
a third controllable semiconductor main-element and a fourth controllable semiconductor main-element each having a control electrode and a controllable load path between two load electrodes, the load paths being operatively connected in series and between the third supply node and the second supply node, the third controllable semiconductor main-element and the fourth controllable semiconductor main-element being connected with each other via a second common node;
a fifth controllable semiconductor main-element having a control electrode and a controllable load path between two load electrodes, the load path being operatively connected between the first common node and an output node; and
a sixth controllable semiconductor main-element having a control electrode and a controllable load path between two load electrodes, the load path being operatively connected between the second common node and the output node,
wherein at least two of the controllable semiconductor main-elements each comprise a plurality of identical controllable semiconductor subcomponents, each subcomponent having a control electrode and a controllable load path between a first load electrode and a second load electrode, the load paths being operatively connected in parallel between the nodes between which the respective controllable semiconductor main-element is connected, and
wherein, in each one of the at least two of the controllable semiconductor main-elements, the first load electrode of each respective controllable semiconductor subcomponent is electrically connected to the respective node via an individual one of a multiplicity of separate output lines, each of the separate output lines being configured to provide identical voltage and current transfers.

2. The semiconductor arrangement of claim 1, wherein, in each one of the at least two of the controllable semiconductor main-elements, the control electrodes of the identical controllable semiconductor subcomponents are each electrically coupled to an individual one of a multiplicity of control terminals via an individual one of a multiplicity of separate control lines, each of the separate control lines being configured to provide identical voltage and current transfers.

3. The semiconductor arrangement of claim 1, wherein the fifth controllable semiconductor main-element has a first switching characteristic and a first transmittance characteristic, wherein the sixth controllable semiconductor main-element has a second switching characteristic and a second transmittance characteristic, wherein the first controllable semiconductor main-element has a third switching characteristic and a third transmittance characteristic, wherein the second controllable semiconductor main-element has a fourth switching characteristic and a fourth transmittance characteristic, wherein the third controllable semiconductor main-element has a fifth switching characteristic and a fifth transmittance characteristic, and wherein the fourth controllable semiconductor main-element has a sixth switching characteristic and a sixth transmittance characteristic.

4. The semiconductor arrangement of claim 3, wherein at least one of the first switching characteristic is identical to the second switching characteristic and the first transmittance characteristic is identical to the second transmittance characteristic, wherein the first switching characteristic is different from the third, fourth, fifth and sixth switching characteristics and the first transmittance characteristic is different from the third, fourth, fifth and sixth transmittance characteristics, and wherein the second switching characteristic is different from the third, fourth, fifth and sixth switching characteristics and the second transmittance characteristic is different from the third, fourth, fifth and sixth transmittance characteristics.

5. The semiconductor arrangement of claim 1, further comprising at least one freewheeling element each having a first electrode and a second electrode, each of the at least one freewheeling element being connected in parallel to the plurality of controllable semiconductor subcomponents of one of the at least two controllable semiconductor main-elements and between the respective nodes, wherein in each one of the at least two of the controllable semiconductor main-elements the first electrode of each freewheeling element is electrically connected to the first load electrode of an individual one of the plurality of controllable semiconductor subcomponents via an individual one of a multiplicity of separate branch lines, each of the individual branch lines being configured to provide identical voltage and current transfers.

6. The semiconductor arrangement of claim 1, wherein the at least two of the controllable semiconductor main-elements comprise at least one of the first controllable semiconductor main-element and the fourth controllable semiconductor main-element, the first and fourth controllable semiconductor main-element forming a first commutation path, wherein the second controllable semiconductor main-element and the third controllable semiconductor main-element form a second commutation path, and wherein the fifth controllable semiconductor main-element and the sixth controllable semiconductor main-element form a third commutation path.

7. The semiconductor arrangement of claim 1, wherein in each one of the at least two controllable semiconductor main-elements at least one of the individual output lines exhibit at least one of identical ohmic behaviors, identical inductive behaviors, and identical capacitive behaviors, wherein the individual control lines exhibit at least one of identical ohmic behaviors, identical inductive behaviors, and identical capacitive behaviors, and wherein the individual branch lines exhibit at least one of identical ohmic behaviors, identical inductive behaviors, and identical capacitive behaviors.

8. The semiconductor arrangement of claim 7, wherein in each one of the at least two controllable semiconductor elements at least one of the individual output lines are wires of identical lengths, identical cross sectional areas, and identical materials, wherein the individual control lines are wires of identical lengths, identical cross sectional areas, and identical materials, and wherein the individual branch lines are wires of identical lengths, identical cross sectional areas, and identical materials.

9. The semiconductor arrangement of claim 1, wherein in each one of the at least two controllable semiconductor elements each of the plurality of identical controllable semiconductor subcomponents comprises a plurality of identical controllable sub-elements.

10. The semiconductor arrangement of claim 9, further comprising:
a multiplicity of first semiconductor bodies each including an individual one of the plurality of controllable sub-elements; and
a multiplicity of second semiconductor bodies each including an individual one of the plurality of freewheeling elements.

11. The semiconductor arrangement of claim 10, further comprising an electrically isolated carrier with a structured metallization, wherein the first semiconductor bodies and the second semiconductor bodies are disposed on and attached to the metallization of the carrier.

12. The semiconductor arrangement of claim 11, wherein each of the first semiconductor bodies comprises:
a first contact pad electrically connected to the first electrode of the corresponding controllable subcomponent disposed on a surface of the respective first semiconductor body facing away from the carrier; and
a second contact pad electrically connected to at least part of the structured metallization of the carrier and to the second electrode of the corresponding controllable subcomponent.

13. The semiconductor arrangement of claim 11, wherein each of the second semiconductor bodies comprises:
a first contact pad electrically connected to the first electrode of the corresponding freewheeling element and disposed at a side of the second semiconductor body facing away from the carrier; and
a second contact pad electrically connected to at least a part of the structured metallization of the carrier and to the second electrode of the corresponding freewheeling element.

14. The semiconductor arrangement of claim 13, wherein the first contact pad of each of the second semiconductor bodies is electrically connected to the first contact pad of an individual one of the first semiconductor bodies via an individual one of a multiplicity of wires.

15. The semiconductor arrangement of claim 13, wherein the second contact pads of the second semiconductor bodies are electrically connected to the second contact pads of the first semiconductor bodies via at least parts of the metallization of the carrier.

* * * * *